(12) United States Patent
Chang et al.

(10) Patent No.: US 10,424,500 B2
(45) Date of Patent: Sep. 24, 2019

(54) SEMICONDUCTOR LIGHT EMITTING DEVICE, TRANSFER HEAD OF SEMICONDUCTOR LIGHT EMITTING DEVICE, AND METHOD OF TRANSFERRING SEMICONDUCTOR LIGHT EMITTING DEVICE

(71) Applicant: LG Electronics Inc., Seoul (KR)

(72) Inventors: Younghak Chang, Seoul (KR); Jina Jeon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 727 days.

(21) Appl. No.: 14/808,009

(22) Filed: Jul. 24, 2015

(65) Prior Publication Data

US 2016/0300745 A1 Oct. 13, 2016

(30) Foreign Application Priority Data

Apr. 7, 2015 (KR) .................. 10-2015-0049187

(51) Int. Cl.
*H01L 21/683* (2006.01)
*H01L 25/075* (2006.01)
*H01L 33/24* (2010.01)
*H01L 33/38* (2010.01)
*H01L 33/62* (2010.01)
(Continued)

(52) U.S. Cl.
CPC ...... *H01L 21/6833* (2013.01); *H01L 25/0753* (2013.01); *H01L 33/24* (2013.01); *H01L 33/38* (2013.01); *H01L 33/62* (2013.01); *H02N 13/00* (2013.01); *H01L 21/6831* (2013.01); *H01L 33/0095* (2013.01); *H01L 2224/95* (2013.01); *H01L 2933/0033* (2013.01)

(58) Field of Classification Search
CPC ............. H01L 21/6831; H01L 21/6833; H01L 25/0753; H01L 33/0095; H01L 33/24; H01L 33/38; H01L 33/62; H01L 2933/0033; H02N 13/00
USPC ........................................ 361/234
See application file for complete search history.

(56) References Cited

U.S. PATENT DOCUMENTS

| 8,333,860 B1 | 12/2012 | Bibl et al. |
| 2002/0096994 A1 | 7/2002 | Iwafuchi et al. |

(Continued)

FOREIGN PATENT DOCUMENTS

| CN | 104094422 A | 10/2014 |
| KR | 10-2010-0046424 A | 5/2010 |

(Continued)

*Primary Examiner* — Kevin J Comber
(74) *Attorney, Agent, or Firm* — Birch, Stewart, Kolasch & Birch, LLP

(57) ABSTRACT

A method of transferring a semiconductor light emitting device, and which includes positioning a transfer head having a head electrode facing a semiconductor light emitting device having an undoped semiconductor layer, the semiconductor light emitting device arranged on a carrier substrate; moving the head electrode of the transfer head close to the undoped semiconductor layer of the semiconductor light emitting device; applying a voltage to the head electrode to provide an attachment force to the undoped semiconductor layer by an electrostatic force; and picking-up the semiconductor light emitting device and transferring the semiconductor light emitting device to base substrate.

9 Claims, 20 Drawing Sheets

(51) Int. Cl.
*H02N 13/00* (2006.01)
*H01L 33/00* (2010.01)

(56) References Cited

U.S. PATENT DOCUMENTS

| | | | |
|---|---|---|---|
| 2010/0102355 A1 | 4/2010 | Jeong | |
| 2012/0018764 A1* | 1/2012 | Choi | H01L 33/20 |
| | | | 257/99 |
| 2013/0070384 A1 | 3/2013 | Cooke et al. | |
| 2013/0316529 A1 | 11/2013 | Golda et al. | |
| 2014/0159065 A1 | 6/2014 | Hu et al. | |
| 2014/0159324 A1 | 6/2014 | Golda et al. | |
| 2014/0169924 A1* | 6/2014 | Golda | H01L 24/75 |
| | | | 414/752.1 |
| 2016/0144608 A1* | 5/2016 | Chang | B32B 37/12 |
| | | | 216/83 |

FOREIGN PATENT DOCUMENTS

| | | |
|---|---|---|
| KR | 10-2013-0041641 A | 4/2013 |
| KR | 10-2013-0118551 A | 10/2013 |
| KR | 10-2013-0136128 A | 12/2013 |

\* cited by examiner

SEMICONDUCTOR LIGHT EMITTING DEVICE, TRANSFER HEAD OF SEMICONDUCTOR LIGHT EMITTING DEVICE, AND METHOD OF TRANSFERRING SEMICONDUCTOR LIGHT EMITTING DEVICE

CROSS-REFERENCE TO RELATED APPLICATION

Pursuant to 35 U.S.C. § 119(a), this application claims the benefit of earlier filing date and right of priority to Korean Application No. 10-2015-0049187, filed on Apr. 7, 2015, the contents of which is incorporated by reference herein in its entirety.

BACKGROUND OF THE INVENTION

1. Field of the Invention

The present invention relates to a display device using a semiconductor light emitting device and a method of manufacturing the same, and more particularly, a semiconductor light emitting device, a transfer head of a semiconductor light emitting device, and a method of transferring a semiconductor light emitting device.

2. Background of the Invention

In recent years, display devices having excellent characteristics such as low profile, flexibility and the like have been developed in the display technical field. On the contrary, currently commercialized main displays are represented by liquid crystal displays (LCDs) and active matrix organic light emitting diodes (AMOLEDs). However, there exist problems such as a slow response time, difficult implementation of flexibility for LCDs, and there exist drawbacks such as short life span, poor yield as well as low flexibility for AMOLEDs.

Further, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting devices can be used to implement a flexible display, thereby presenting a scheme for solving the problems.

For a flexible display using a semiconductor light emitting device, a plurality of semiconductor light emitting devices are grown on a wafer, and then are transferred to positions corresponding to pixels of the flexible display. However, the transfer process is inefficient and results in a poor yield and low reliability.

SUMMARY OF THE INVENTION

Therefore, an aspect of the detailed description is to provide a novel method of transferring semiconductor light emitting devices with a higher reliability. More specifically, the present invention is to provide a method of transferring a semiconductor light emitting device with a larger grip force, and a transfer device.

Another aspect of the detailed description is to provide a semiconductor light emitting device suitable for a method of transferring a semiconductor light emitting device, and a transfer head.

To achieve these and other advantages and in accordance with the purpose of this specification, as embodied and broadly described herein, the present invention provides in one aspect a semiconductor light emitting device, including: a first conductive electrode and a second conductive electrode; a first conductive semiconductor layer where the first conductive electrode is formed; a second conductive semiconductor layer overlapped with the first conductive semiconductor layer, and having one surface where the second conductive electrode is formed; and an undoped semiconductor layer formed on another surface of the second conductive semiconductor layer, wherein the second conductive electrode extends from one surface of the second conductive semiconductor layer to a side surface of the undoped semiconductor layer, and protrudes from a side surface of the undoped semiconductor layer.

In another aspect, the present inventions provides a transfer head of a semiconductor light emitting device, including: a base substrate; a protrusion protruding from the base substrate; and a head electrode arranged at the protrusion so as to generate an electrostatic force by electrifying an undoped semiconductor layer of a semiconductor light emitting device.

In still another aspect, the present invention provides a method of transferring a semiconductor light emitting device, including: positioning a transfer head having a head electrode so as to face a semiconductor light emitting device having an undoped semiconductor layer, the semiconductor light emitting device arranged on a carrier substrate; moving the head electrode of the transfer head close to the undoped semiconductor layer of the semiconductor light emitting device; applying a voltage to the head electrode such that an attachment force is provided to the undoped semiconductor layer by an electrostatic force; and picking-up the semiconductor light emitting device and transferring it to the transfer head.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Figure 1:
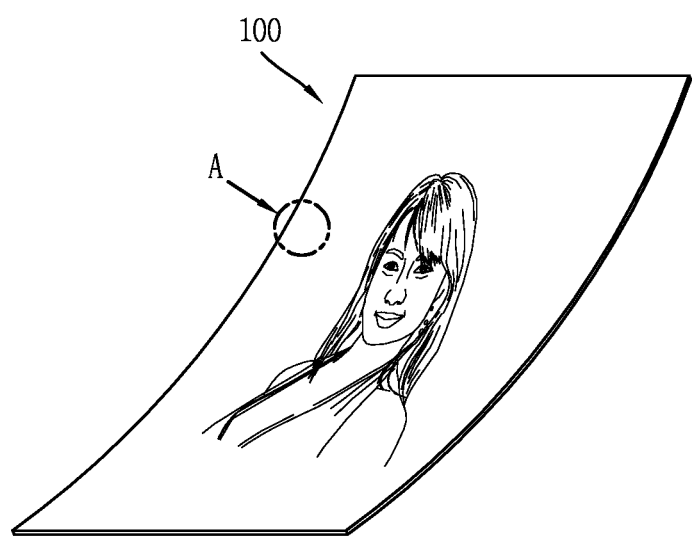
FIG. 1 is a conceptual view illustrating a display device using a semiconductor light emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function. Also, the accompanying drawings are merely illustrated to easily explain the concept of the invention, and therefore, they should not be construed to limit the technological concept disclosed herein by the accompanying drawings. Furthermore, when an element such as a layer, region or substrate is referred to as being "on" another element, it can be directly on the another element or an intermediate element may also be interposed therebetween.

A display device disclosed herein includes a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, a configuration disclosed herein can be applicable to any displayable device even though it is a new product type which will be developed later.

FIG. 1 is a conceptual view illustrating a display device using a semiconductor light emitting device according to an embodiment of the present disclosure. According to the drawing, information processed in the controller of the display device 100 can be displayed using a flexible display. The flexible display includes a flexible, bendable, twistable, foldable and rollable display. For example, the flexible display can be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration can be visual information displayed on a curved surface. The visual information can be implemented by individually controlling the light emission of sub-pixels disposed in a matrix form. The sub-pixel denotes a minimum unit for implementing one color.

The sub-pixel of the flexible display can be implemented by a semiconductor light emitting device. According to the present disclosure, a light emitting diode (LED) is illustrated as a type of semiconductor light emitting device. The light emitting diode can be formed with a small size to perform the role of a sub-pixel even in the second configuration through this.

Figure 2:
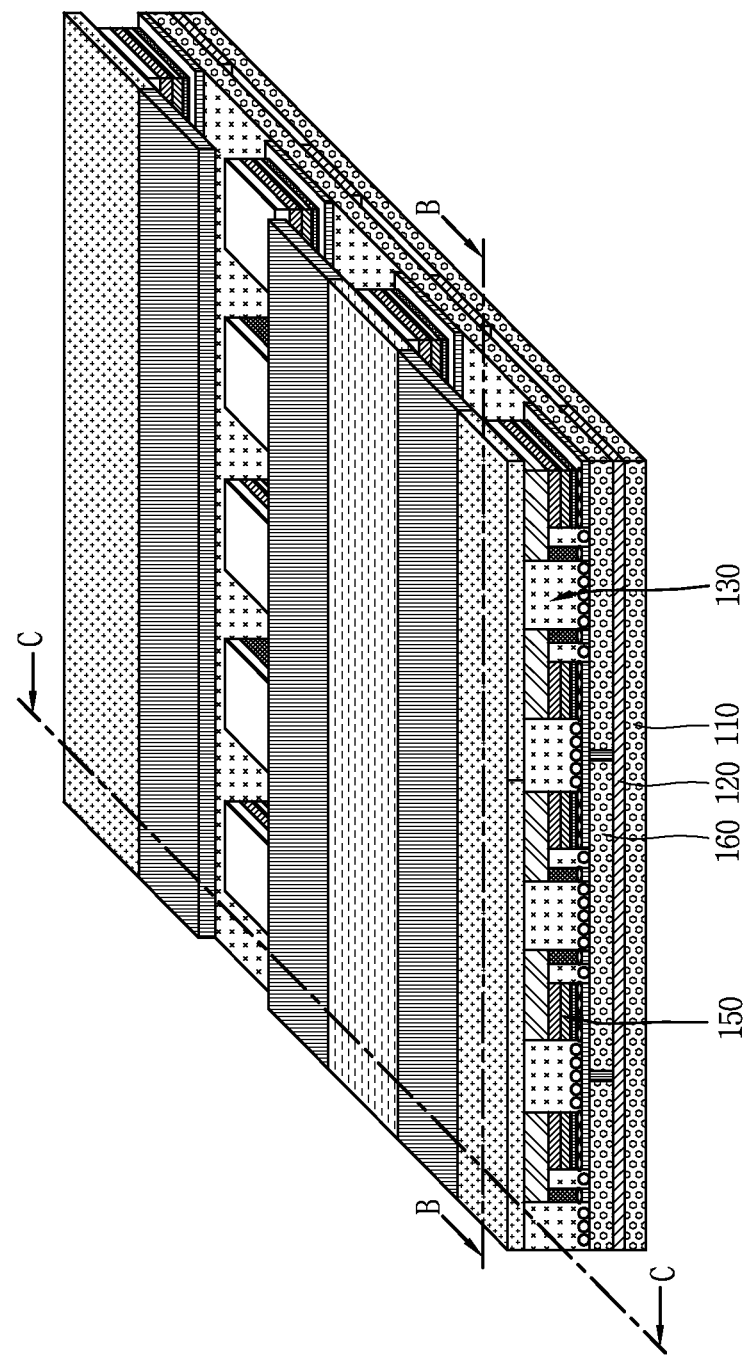
FIG. 2 is a partial enlarged view of portion 'A' in FIG. 1, and FIGS. 3A and 3B are cross-sectional views taken along lines B-B and C-C in FIG. 2.

Hereinafter, a flexible display implemented using the light emitting diode will be described in more detail with reference to the accompanying drawings. FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

Figure 3A:
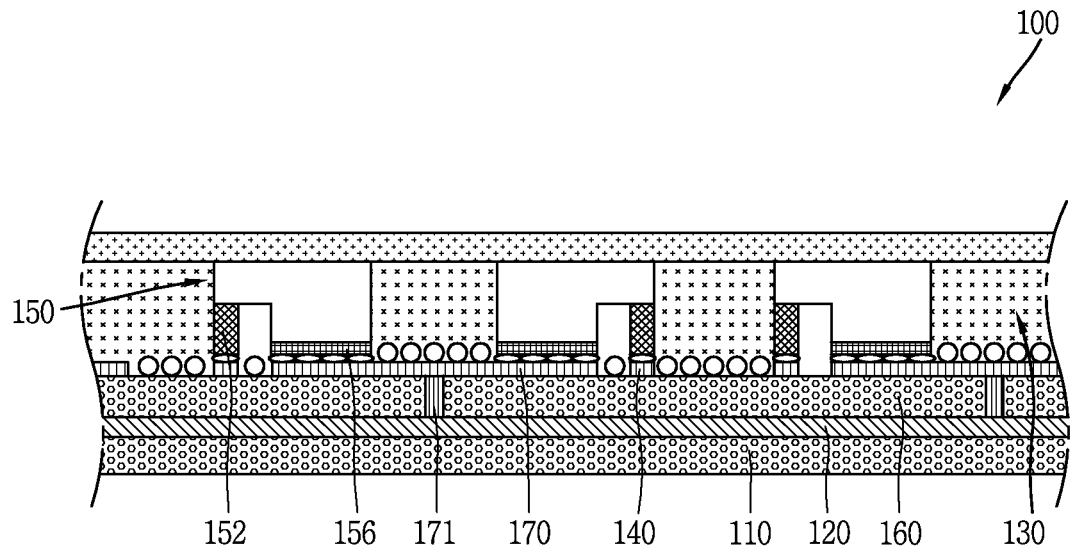
Figure 3B:
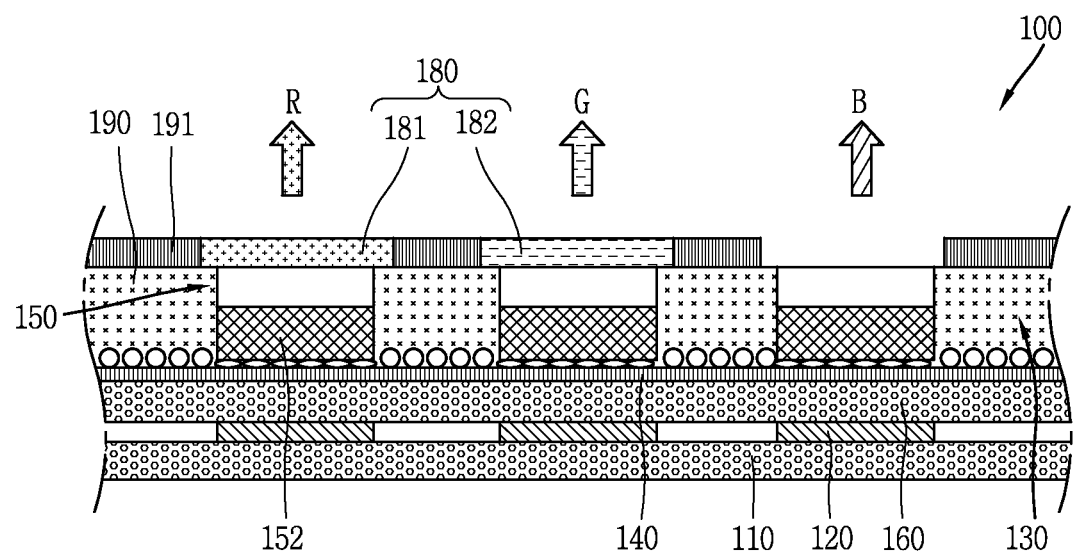
Figure 4:
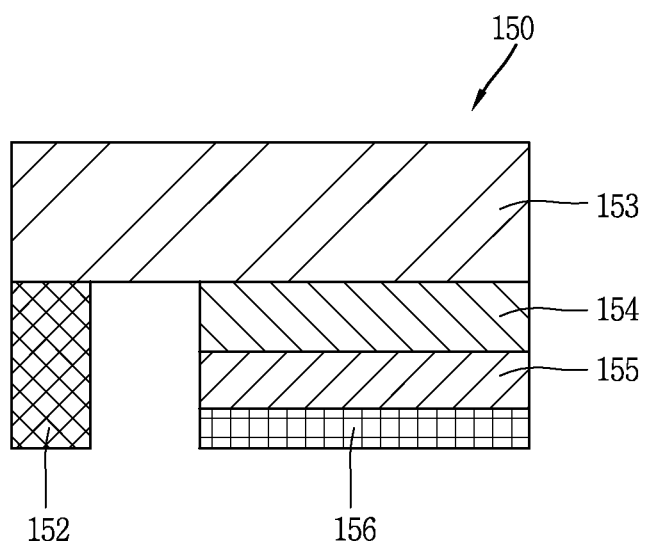
FIG. 4 is a conceptual view illustrating a flip-chip type semiconductor light emitting device in FIG. 3.

FIGS. 2, 3A and 3B illustrate a display device 100 using a passive matrix (PM) type semiconductor light emitting device. However, the following illustration is also applicable to an active matrix (AM) type semiconductor light emitting device.

The display device 100 includes a substrate 110, a first electrode 120, a conductive adhesive layer 130, a second electrode 140, and a plurality of semiconductor light emitting devices 150. The substrate 110 includes a flexible substrate. For example, the substrate 110 may contain glass or polyimide (PI) to implement the flexible display device. In addition, if it is a flexible material, any one such as polyethylene naphthalate (PEN), polyethylene terephthalate (PET) or the like can be used. Furthermore, the substrate 110 can be either one of transparent and non-transparent materials.

The substrate 110 can be a wiring substrate disposed with the first electrode 120, and thus the first electrode 120 can be placed on the substrate 110. As shown, an insulating layer 160 is disposed on the substrate 110 placed with the first electrode 120, and an auxiliary electrode 170 is placed on the insulating layer 160. In this instance, a configuration in which the insulating layer 160 is deposited on the substrate 110 can be single wiring substrate. More specifically, the insulating layer 160 can be incorporated into the substrate 110 with an insulating and flexible material such as polyimide (PI), PET, PEN or the like to form single wiring substrate.

The auxiliary electrode 170 as an electrode for electrically connecting the first electrode 120 to the semiconductor light emitting device 150 is placed on the insulating layer 160, and disposed to correspond to the location of the first electrode 120. For example, the auxiliary electrode 170 has a dot shape, and can be electrically connected to the first electrode 120 by an electrode hole 171 passing through the insulating layer 160. The electrode hole 171 can be formed by filling a conductive material in a via hole.

Further, the conductive adhesive layer 130 is formed on one surface of the insulating layer 160, but the present disclosure is not limited to this. For example, it is possible to also have a structure in which the conductive adhesive layer 130 is disposed on the substrate 110 with no insulating layer 160. The conductive adhesive layer 130 performs the role of an insulating layer in the structure in which the conductive adhesive layer 130 is disposed on the substrate 110.

In addition, the conductive adhesive layer 130 can be a layer having adhesiveness and conductivity, and thus a conductive material and an adhesive material can be mixed on the conductive adhesive layer 130. Furthermore, the conductive adhesive layer 130 may have flexibility, thereby allowing a flexible function in the display device. For such an example, the conductive adhesive layer 130 can be an anisotropic conductive film (ACF), an anisotropic conductive paste, a solution containing conductive particles, and the like. The conductive adhesive layer 130 allows electrical interconnection in the z-direction passing through the thickness thereof, but can be configured as a layer having electrical insulation in the horizontal x-y direction thereof. Accordingly, the conductive adhesive layer 130 can be referred to as a z-axis conductive layer (however, hereinafter referred to as a "conductive adhesive layer").

The anisotropic conductive film includes an anisotropic conductive medium mixed with an insulating base member, and thus when heat and pressure are applied thereto, only a specific portion thereof has conductivity by the anisotropic conductive medium. Hereinafter, heat and pressure are applied to the anisotropic conductive film, but other methods are also available for the anisotropic conductive film to partially have conductivity. The methods include applying only either one of heat and pressure thereto, UV curing, and the like.

Furthermore, the anisotropic conductive medium can be conductive balls or particles. According to the drawing, in the present embodiment, the anisotropic conductive film includes an anisotropic conductive medium mixed with an insulating base member, and thus when heat and pressure are applied thereto, only a specific portion thereof has conductivity by the conductive balls. The anisotropic conductive film includes a core with a conductive material containing a plurality of particles coated by an insulating layer with a polymer material, and in this instance, it has conductivity by the core while breaking an insulating layer on a portion to which heat and pressure are applied. Here, a core can be transformed to implement a layer having both surfaces to which objects contact in the thickness direction of the film.

For a more specific example, heat and pressure are applied to an anisotropic conductive film as a whole, and electrical connection in the z-axis direction is partially formed by a height difference from a mating object adhered by the use of the anisotropic conductive film. In another example, an anisotropic conductive film can include a plurality of particles in which a conductive material is coated on insulating cores. In this instance, a portion to which heat and pressure are applied can be converted (pressed and adhered) to a conductive material to have conductivity in the thickness direction of the film. For still another example, the film can be formed to have conductivity in the thickness direction in which a conductive material passes through an insulating base member in the z-direction. In this instance, the conductive material may have a pointed end portion.

According to the drawings, the anisotropic conductive film is a fixed array anisotropic conductive film (ACF) having conductive balls inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure is not limited to this, and the anisotropic conductive film can have a form in which conductive balls are randomly mixed with an insulating base member or a form configured with a plurality of layers in which conductive balls are disposed at any one layer (double-ACF), and the like. The anisotropic conductive paste as a form coupled to a paste and conductive balls can be a paste in which conductive balls are mixed with an insulating and adhesive base material. Furthermore, a solution containing conductive particles can be a solution in a form containing conductive particles or nano particles.

Referring to the drawings again, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140. When the conductive adhesive layer 130 is formed in a state that the auxiliary electrode 170 and second electrode 140 are located, and then the semiconductor light emitting device 150 is connect thereto in a flip chip form with the application of heat and pressure, the semiconductor light emitting device 150 is electrically connected to the first electrode 120 and second electrode 140.

Referring to FIG. 4, the semiconductor light emitting device can be a flip chip type semiconductor light emitting device. For example, the semiconductor light emitting device 150 includes a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this instance, the p-type electrode 156 can be electrically connected to the welding portion by the conductive adhesive layer 130, and the n-type electrode 152 can be electrically connected to the second electrode 140.

Referring to FIGS. 2, 3A and 3B again, the auxiliary electrode 170 can be formed in an elongated manner in one direction to be electrically connected to a plurality of semiconductor light emitting devices 150. For example, the left and right p-type electrodes of the semiconductor light emitting devices around the auxiliary electrode can be electrically connected to one auxiliary electrode.

More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no push-down of the semiconductor light emitting device. Furthermore, a plurality of semiconductor light emitting devices 150 constitute a light-emitting array, and a phosphor layer 180 is formed on the light-emitting array.

The light emitting device includes a plurality of semiconductor light emitting devices with different self luminance values. Each of the semiconductor light emitting devices 150 constitutes a sub-pixel, and is electrically connected to the first electrode 120. For example, there may exist a plurality of first electrodes 120, and the semiconductor light emitting devices are arranged in several rows, for instance, and each row of the semiconductor light emitting devices can be electrically connected to any one of the plurality of first electrodes.

Furthermore, the semiconductor light emitting devices can be connected in a flip chip form, and thus semiconductor light emitting devices grown on a transparent dielectric substrate. In addition, the semiconductor light emitting devices can be nitride semiconductor light emitting devices, for instance. The semiconductor light emitting device 150 has an excellent luminance characteristic, and thus it is possible to configure individual sub-pixels even with a small size thereof.

According to FIG. 3B, a partition wall 190 is formed between the semiconductor light emitting devices 150. In this instance, the partition wall 190 performs the role of dividing individual sub-pixels from one another, and can be formed as an integral body with the conductive adhesive layer 130. For example, a base member of the anisotropic conductive film can form the partition wall when the semiconductor light emitting device 150 is inserted into the anisotropic conductive film.

Furthermore, when the base member of the anisotropic conductive film is black, the partition wall 190 can have reflective characteristics while at the same time increasing contrast with no additional black insulator. In another example, a reflective partition wall can be separately provided with the partition wall 190. In this instance, the partition wall 190 includes a black or white insulator according to the purpose of the display device. The partition wall can enhance reflectivity when the partition wall of the while insulator is used, and increase contrast while at the same time having reflective characteristics.

Further, the phosphor layer 180 can be located at an outer surface of the semiconductor light emitting device 150. For example, the semiconductor light emitting device 150 can be a blue semiconductor light emitting device that emits blue (B) light, and the phosphor layer 180 converts the blue (B) light into the color of a sub-pixel. As shown in FIG. 3B, the phosphor layer 180 can be a red phosphor layer 181 or green phosphor layer 182 constituting individual pixels.

In other words, a red phosphor 181 capable of converting blue light into red (R) light can be deposited on the blue semiconductor light emitting device 151 at a location implementing a red sub-pixel, and a green phosphor 182 capable of converting blue light into green (G) light can be deposited on the blue semiconductor light emitting device 151 at a location implementing a green sub-pixel. Furthermore, only the blue semiconductor light emitting device 151 can be used at a location implementing a blue sub-pixel. In this instance, the red (R), green (G) and blue (B) sub-pixels may implement one pixel. More specifically, one color phosphor can be deposited along each line of the first electrode 120. Accordingly, one line on the first electrode 120 can be an electrode controlling one color. In other words, red (R), green (B) and blue (B) can be sequentially disposed, thereby implementing sub-pixels.

However, the present disclosure is not limited to this, and the semiconductor light emitting device 150 can be combined with a quantum dot (QD) instead of a phosphor to implement sub-pixels such as red (R), green (G) and blue (B). Furthermore, a black matrix 191 can be disposed between each phosphor layer to enhance contrast. In other words, the black matrix 191 can enhance the contrast of luminance. However, the present disclosure is not limited to this, and another structure for implementing blue, red and green can be also applicable thereto.

Figure 5A:
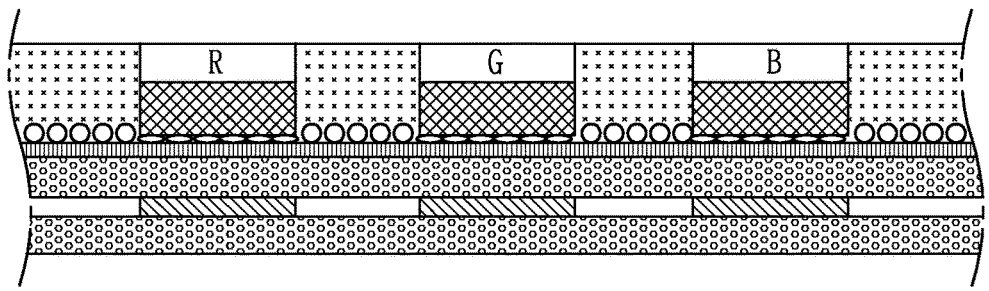
FIGS. 5A through 5C are conceptual views illustrating various forms for implementing colors in connection with a flip-chip type semiconductor light emitting device.

Referring to FIG. 5A, each of the semiconductor light emitting devices 150 can be implemented with a high-power light emitting device that emits various lights including blue in which gallium nitride (GaN) is mostly used, and indium (In) and or aluminum (Al) are added thereto. In this instance, the semiconductor light emitting device 150 can be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by the red, green and blue semiconductor light emitting devices, thereby implementing a full color display.

Figure 5B:
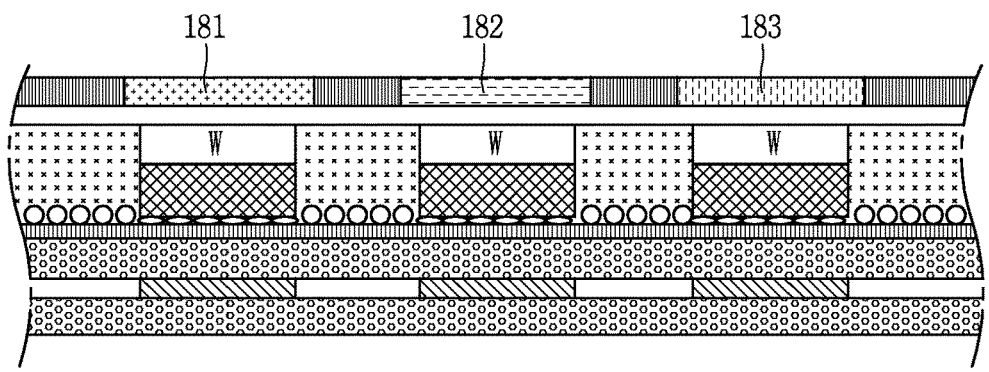

Referring to FIG. 5B, the semiconductor light emitting device can have a white light emitting device (W) provided with a yellow phosphor layer for each element. In this instance, a red phosphor layer 181, a green phosphor layer 182 and blue phosphor layer 183 can be provided on the white light emitting device (W) to implement a sub-pixel. Furthermore, a color filter repeated with red, green and blue on the white light emitting device (W) can be used to implement a sub-pixel.

Figure 5C:
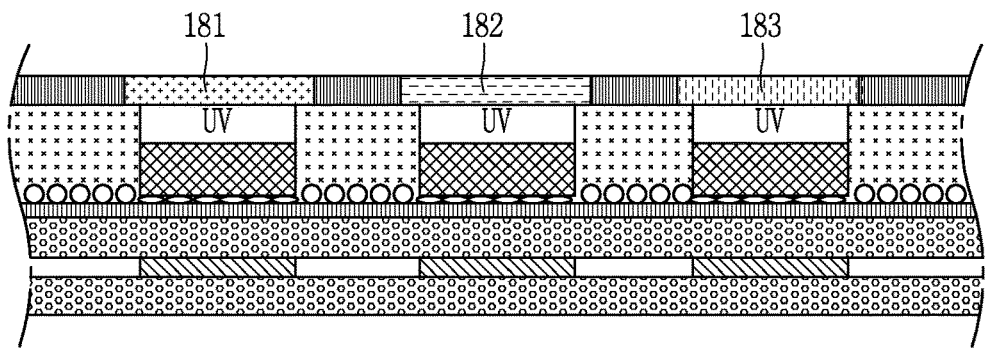

Referring to FIG. 5C, it is possible to also have a structure in which a red phosphor layer 181, a green phosphor layer 182 and blue phosphor layer 183 are provided on a ultra violet light emitting device (UV). Thus, the semiconductor light emitting device can be used over the entire region up to ultra violet (UV) as well as visible light, and can be extended to a form of semiconductor light emitting device in which ultra violet (UV) can be used as an excitation source.

Taking the present example into consideration again, the semiconductor light emitting device 150 is placed on the conductive adhesive layer 130 to configure a sub-pixel in the display device. The semiconductor light emitting device 150 has excellent luminance characteristics, and thus it is possible to configure individual sub-pixels even with a small size thereof. The size of the individual semiconductor light emitting device 150 can be less than 80 µm in the length of one side thereof, and formed with a rectangular or square shaped element. For a rectangular shaped element, the size thereof can be less than 20×80 µm.

Furthermore, even a square shaped semiconductor light emitting device 150 with a length of side of 10 µm used for a sub-pixel will exhibit a sufficient brightness for implementing a display device. Accordingly, for example, for a rectangular pixel in which one side of a sub-pixel is 600 µm in size, and the remaining one side thereof is 300 µm, a relative distance between the semiconductor light emitting devices becomes sufficiently large. Accordingly, in this instance, it is possible to implement a flexible display device having a HD image quality.

A display device using the foregoing semiconductor light emitting device will be fabricated by a novel type of fabrication method. Hereinafter, the fabrication method will be described with reference to FIG. 6. In particular, FIG. 6 is cross-sectional views illustrating a method of fabricating a display device using a semiconductor light emitting device according to the present disclosure.

Figure 6:
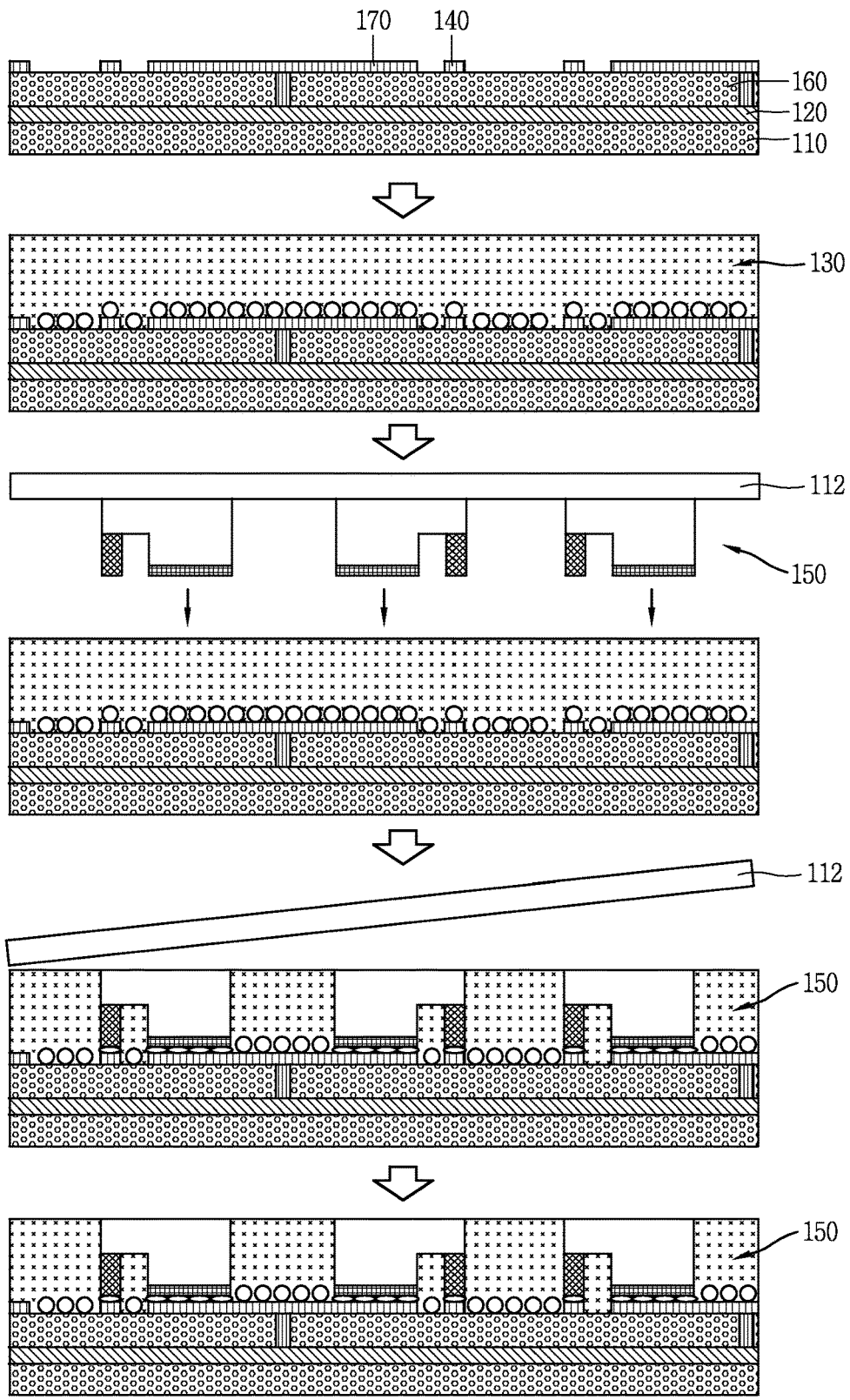
FIG. 6 is cross-sectional views illustrating a method of fabricating a display device using a semiconductor light emitting device according to the present disclosure.

Referring to FIG. 6, first, the conductive adhesive layer 130 is formed on the insulating layer 160 located with the auxiliary electrode 170 and second electrode 140. The insulating layer 160 is deposited on the first substrate 110 to form one substrate 110 (or wiring substrate), and the first electrode 120, auxiliary electrode 170 and second electrode 140 are disposed at the wiring substrate 110. In this instance, the first electrode 120 and second electrode 140 can be disposed in a perpendicular direction to each other. Furthermore, the first substrate 110 and insulating layer 160 may contain glass or polyimide (PI), respectively, to implement a flexible display device. The conductive adhesive layer 130 can be implemented by an anisotropic conductive film, for example, and thus, an anisotropic conductive film can be coated on a substrate located with the insulating layer 160.

Next, a second substrate 112 located with a plurality of semiconductor light emitting devices 150 corresponding to the location of the auxiliary electrodes 170 and second electrodes 140 and constituting individual pixels is disposed such that the semiconductor light emitting device 150 faces the auxiliary electrode 170 and second electrode 140. In this instance, the second substrate 112 as a growth substrate for growing the semiconductor light emitting device 150 can be a sapphire substrate or silicon substrate. In addition, the semiconductor light emitting device can have a gap and size capable of implementing a display device when formed in the unit of wafer, and thus effectively used for a display device.

Next, the wiring substrate is thermally compressed to the second substrate 112. For example, the wiring substrate and second substrate 112 can be thermally compressed to each other by applying an ACF press head. The wiring substrate and second substrate 112 are bonded to each other using the thermal compression. In addition, only a portion between the semiconductor light emitting device 150 and the auxiliary electrode 170 and second electrode 140 have conductivity due to the characteristics of an anisotropic conductive film having conductivity by thermal compression, thereby allowing the electrodes and semiconductor light emitting device 150 to be electrically connected to each other. Further, the semiconductor light emitting device 150 can be inserted into the anisotropic conductive film, thereby forming a partition wall between the semiconductor light emitting devices 150.

Next, the second substrate 112 is removed. For example, the second substrate 112 can be removed using a laser lift-off (LLO) or chemical lift-off (CLO) method. Finally, the second substrate 112 is removed to expose the semiconductor light emitting devices 150 to the outside. Silicon oxide (SiOx) or the like can be coated on the wiring substrate coupled to the semiconductor light emitting device 150 to form a transparent insulating layer.

In addition, a phosphor layer can be formed on one surface of the semiconductor light emitting device 150. For example, the semiconductor light emitting device 150 can be a blue semiconductor light emitting device for emitting blue (B) light, and red or green phosphor for converting the blue (B) light into the color of the sub-pixel may form a layer on one surface of the blue semiconductor light emitting device.

Figure 7:
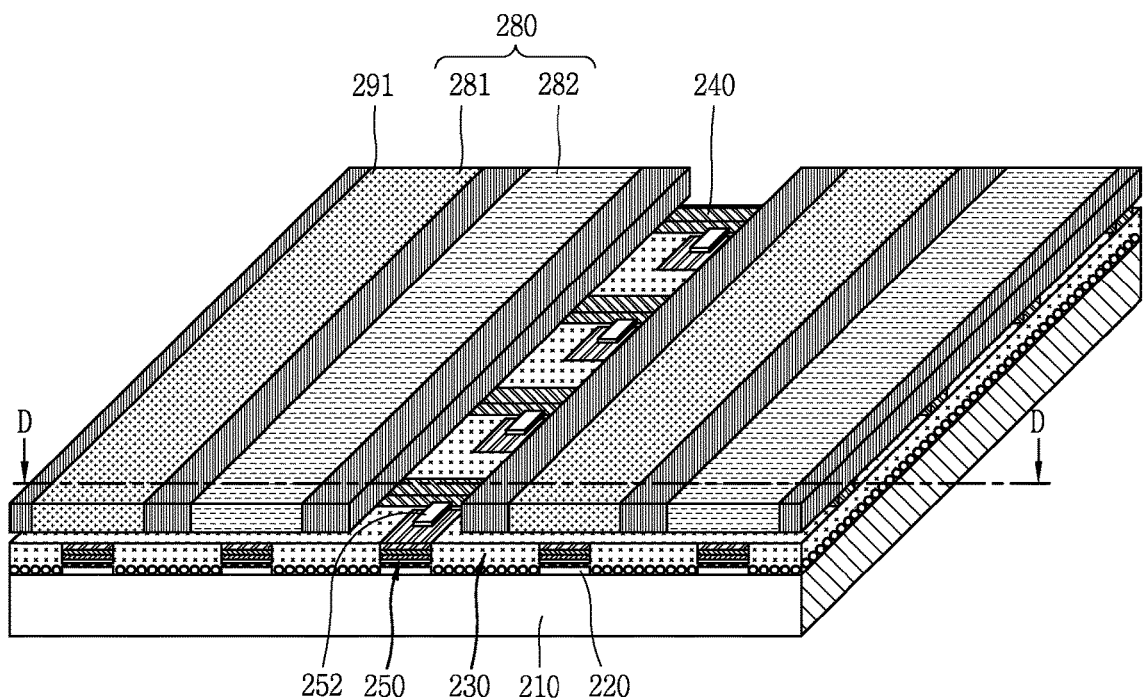
FIG. 7 is a perspective view illustrating a display device using a semiconductor light emitting device according to another embodiment of the present disclosure.
Figure 8:
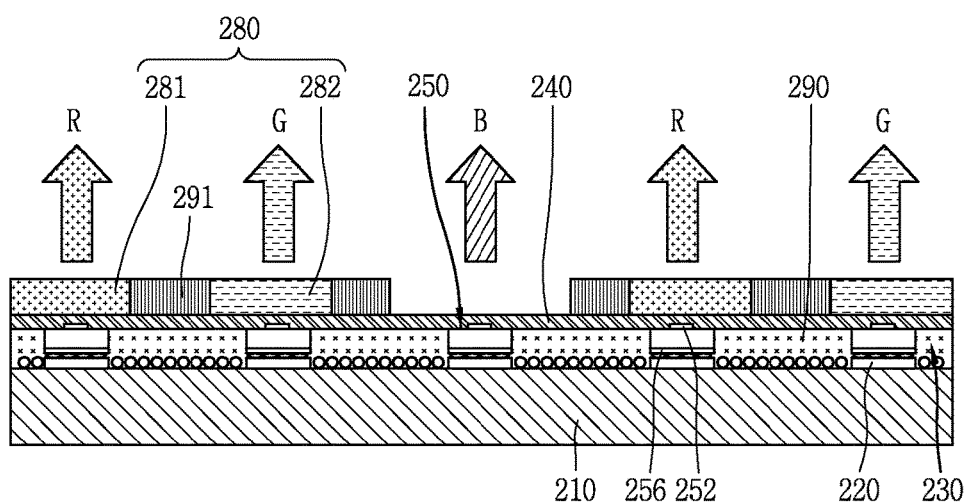
FIG. 8 is a cross-sectional view taken along line D-D in FIG. 7.
Figure 9:
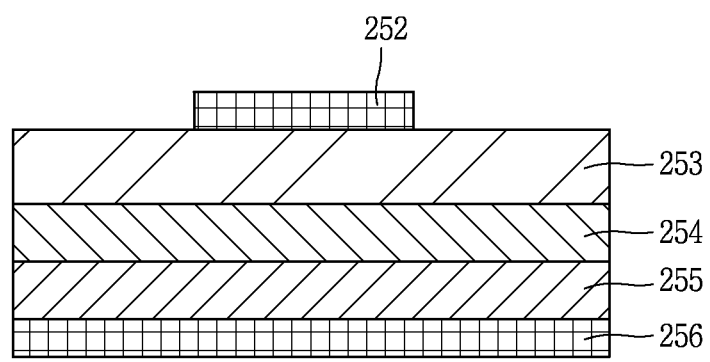
FIG. 9 is a conceptual view illustrating a vertical type semiconductor light emitting device in FIG. 8.

The fabrication method or structure of a display device using the foregoing semiconductor light emitting device can be modified in various forms. For example, the foregoing display device is applicable to a vertical semiconductor light emitting device. In particular, FIG. 7 is a perspective view illustrating a display device using a semiconductor light emitting device according to another embodiment of the present disclosure, FIG. 8 is a cross-sectional view taken along line C-C in FIG. 7, and FIG. 9 is a conceptual view illustrating a vertical type semiconductor light emitting device in FIG. 8.

The display device can be a display device using a passive matrix (PM) type of vertical semiconductor light emitting device. As shown, the display device includes a substrate 210, a first electrode 220, a conductive adhesive layer 230, a second electrode 240 and a plurality of semiconductor light emitting devices 250.

Further, the substrate 210 as a wiring substrate disposed with the first electrode 220 includes polyimide (PI) to implement a flexible display device. In addition, any one can be used if it is an insulating and flexible material. As shown, the first electrode 220 can be located on the substrate 210, and formed with an electrode having a bar elongated in one direction. The first electrode 220 also performs the role of a data electrode.

The conductive adhesive layer 230 is formed on the substrate 210 located with the first electrode 220. Similarly to a display device to which a flip chip type light emitting device is applied, the conductive adhesive layer 230 can be an anisotropic conductive film (ACF), an anisotropic conductive paste, a solution containing conductive particles, and the like. However, the present embodiment illustrates the conductive adhesive layer 230 being implemented by an anisotropic conductive film.

When an anisotropic conductive film is located in a state that the first electrode 220 is located on the substrate 210, and then heat and pressure are applied to connect the semiconductor light emitting device 250 thereto, the semiconductor light emitting device 250 is electrically connected to the first electrode 220. Further, the semiconductor light emitting device 250 is preferably disposed on the first electrode 220. The electrical connection is generated because an anisotropic conductive film partially has conductivity in the thickness direction when heat and pressure are applied as described above. Accordingly, the anisotropic conductive film is partitioned into a portion having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light emitting device 250 and the first electrode 220. Thus, the semiconductor light emitting device 250 is placed on the conductive adhesive layer 230, thereby configuring a separate sub-pixel in the display device. The semiconductor light emitting device 250 may have excellent luminance characteristics, and thus it is possible to configure individual sub-pixels even with a small size thereof. The size of the individual semiconductor light emitting device 250 can be less than 80 μm in the length of one side thereof, and formed with a rectangular or square shaped element. In case of a rectangular shaped element, the size thereof can be less than 20×80 μm.

Further, the semiconductor light emitting device 250 has a vertical structure. A plurality of second electrodes 240 disposed in a direction crossed with the length direction of the first electrode 220, and electrically connected to the vertical semiconductor light emitting device 250 are located between vertical semiconductor light emitting devices.

Referring to FIG. 9, the vertical semiconductor light emitting device includes a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this instance, the p-type electrode 256 located at the bottom thereof can be electrically connected to the first electrode 220 by the conductive adhesive layer 230, and the n-type electrode 252 located at the top thereof can be electrically connected to the second electrode 240 which will be described later. The electrodes can be disposed in the upward/downward direction in the vertical semiconductor light emitting device 250, thereby providing a great advantage capable of reducing the chip size.

Referring again to FIG. 8, a phosphor layer 280 can be formed on one surface of the semiconductor light emitting device 250. For example, the semiconductor light emitting device 250 is a blue semiconductor light emitting device 251 that emits blue (B) light, and the phosphor layer 280 for converting the blue (B) light into the color of the sub-pixel can be provided thereon. In this instance, the phosphor layer 280 can be a red phosphor 281 and a green phosphor 282 constituting individual pixels.

In other words, a red phosphor 281 capable of converting blue light into red (R) light can be deposited on the blue semiconductor light emitting device 251 at a location implementing a red sub-pixel, and a green phosphor 282 capable of converting blue light into green (G) light can be deposited on the blue semiconductor light emitting device 251 at a location implementing a green sub-pixel. Furthermore, the blue semiconductor light emitting device 251 can be solely used at a location implementing a blue sub-pixel. In this instance, the red (R), green (G) and blue (B) sub-pixels implement one pixel. However, the present disclosure is not limited to this, and another structure for implementing blue, red and green is also applicable thereto as described above in a display device to which a flip chip type light emitting device is applied.

Further, the second electrode 240 is located between the semiconductor light emitting devices 250, and electrically connected to the semiconductor light emitting devices 250. For example, the semiconductor light emitting devices 250 can be disposed in a plurality of rows, and the second electrode 240 can be located between the rows of the semiconductor light emitting devices 250. Since a distance between the semiconductor light emitting devices 250 constituting individual pixels is sufficiently large, the second electrode 240 can be located between the semiconductor light emitting devices 250.

The second electrode 240 can be formed with an electrode having a bar elongated in one direction, and disposed in a perpendicular direction to the first electrode. Furthermore, the second electrode 240 can be electrically connected to the semiconductor light emitting device 250 by a connecting electrode protruded from the second electrode 240. More specifically, the connecting electrode can be an n-type electrode of the semiconductor light emitting device 250. For example, the n-type electrode is formed with an ohmic electrode for ohmic contact, and the second electrode covers at least part of the ohmic electrode by printing or deposition. Thus, the second electrode 240 can be electrically connected to the n-type electrode of the semiconductor light emitting device 250.

As shown in FIGS. 7 and 8, the second electrode 240 is located on the conductive adhesive layer 230. A transparent insulating layer containing silicon oxide (SiOx) may also be formed on the substrate 210 including the semiconductor light emitting device 250. When the transparent insulating layer is formed and then the second electrode 240 is placed thereon, the second electrode 240 can be located on the transparent insulating layer. Furthermore, the second electrode 240 can be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of bad adhesiveness with an n-type semiconductor. Accordingly, the second electrode 240 can be placed between the semiconductor light emitting devices 250, thereby obtaining an advantage in which the transparent electrode is not required. Accordingly, an n-type semiconductor layer and a conductive material having a good adhesiveness can be used as a horizontal electrode without being restricted by the selection of a transparent material, thereby enhancing the light extraction efficiency.

As shown in FIG. 8, a partition wall 290 can be formed between the semiconductor light emitting devices 250. In other words, the partition wall 290 can be disposed between the vertical semiconductor light emitting devices 250 to isolate the semiconductor light emitting device 250 constituting individual pixels. In this instance, the partition wall 290 divides individual sub-pixels from one another, and be formed as an integral body with the conductive adhesive layer 230. For example, a base member of the anisotropic conductive film can form the partition wall when the semiconductor light emitting device 250 is inserted into the anisotropic conductive film.

Furthermore, when the base member of the anisotropic conductive film is black, the partition wall 290 may have reflective characteristics while at the same time increasing contrast with no additional black insulator. In another example, a reflective partition wall can be separately provided with the partition wall 290. In this instance, the partition wall 290 includes a black or white insulator according to the purpose of the display device.

If the second electrode 240 is precisely located on the conductive adhesive layer 230 between the semiconductor light emitting devices 250, the partition wall 290 can be located between the semiconductor light emitting device 250 and second electrode 240. Accordingly, individual sub-pixels can be configured even with a small size using the semiconductor light emitting device 250, and a distance between the semiconductor light emitting devices 250 is relatively sufficiently large to place the second electrode 240 between the semiconductor light emitting devices 250, thereby having the effect of implementing a flexible display device having a HD image quality. Furthermore, as shown in FIG. 8, a black matrix 291 can be disposed between each phosphor layer to enhance contrast. In other words, the black matrix 291 can enhance the contrast of luminance.

As described above, the semiconductor light emitting device 250 is located on the conductive adhesive layer 230, thereby constituting individual pixels on the display device. Since the semiconductor light emitting device 250 has excellent luminance characteristics, individual sub-pixels can have a small size thereof. As a result, it is possible to implement a full color display in which the sub-pixels of red (R), green (G) and blue (B) implement one pixel by the semiconductor light emitting device.

In a display device using the aforementioned semiconductor light emitting device, if a flip-chip type semiconductor light emitting device is applied, a first electrode and a second electrode are arranged on the same plane. This may cause a difficulty in implementing a fine pitch. Hereinafter, a display device, to which a flip-chip type light emitting device according to another embodiment of the present invention is applied, will be explained.

Figure 10:
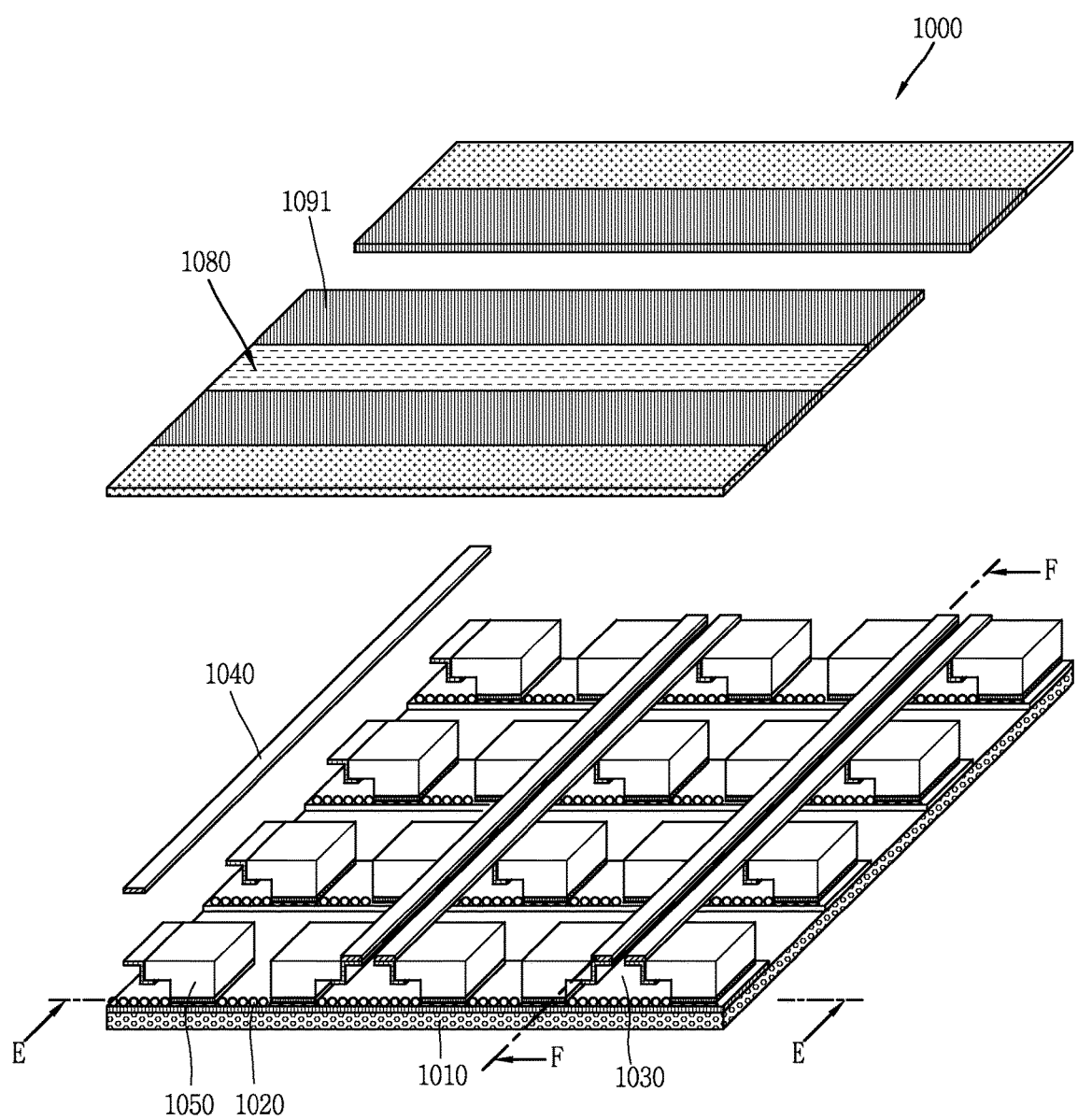
FIG. 10 is an enlarged view of part 'A' in FIG. 1, which illustrates another embodiment of the present invention to which a semiconductor light emitting device of a novel structure is applied.
Figure 11A:
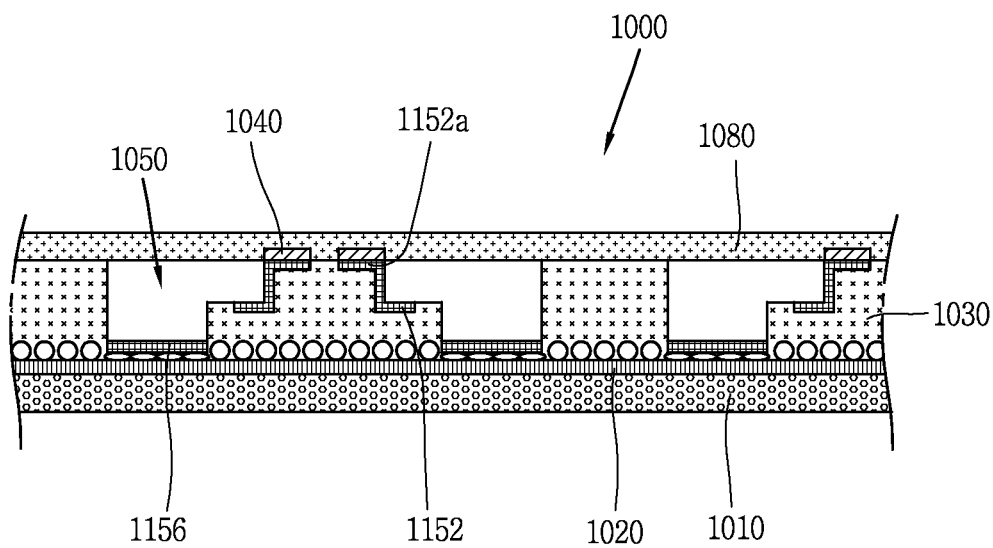
FIG. 11A is a sectional view taken along line 'E-E' in FIG. 10.
Figure 11B:
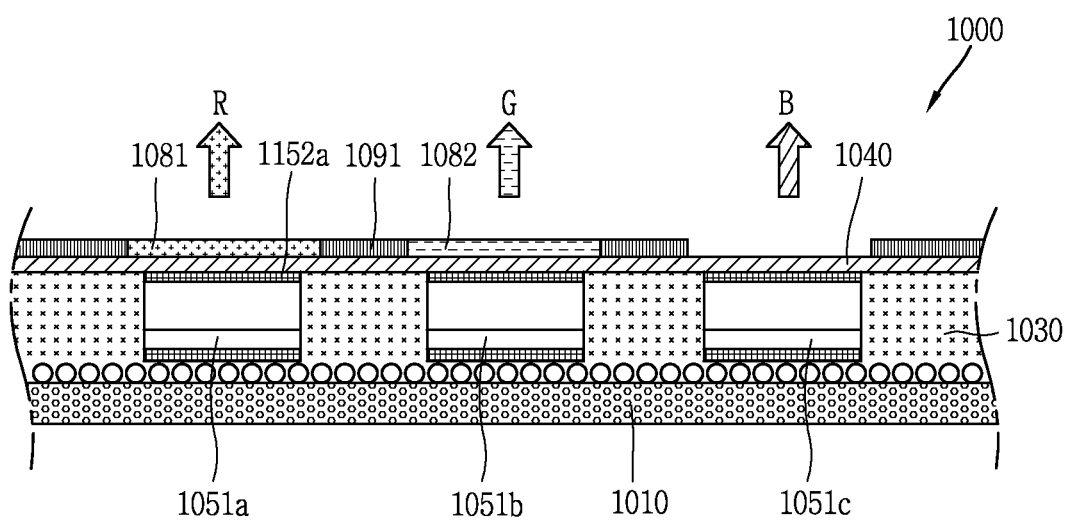
FIG. 11B is a sectional view taken along line 'F-F' in FIG. 11.
Figure 12:
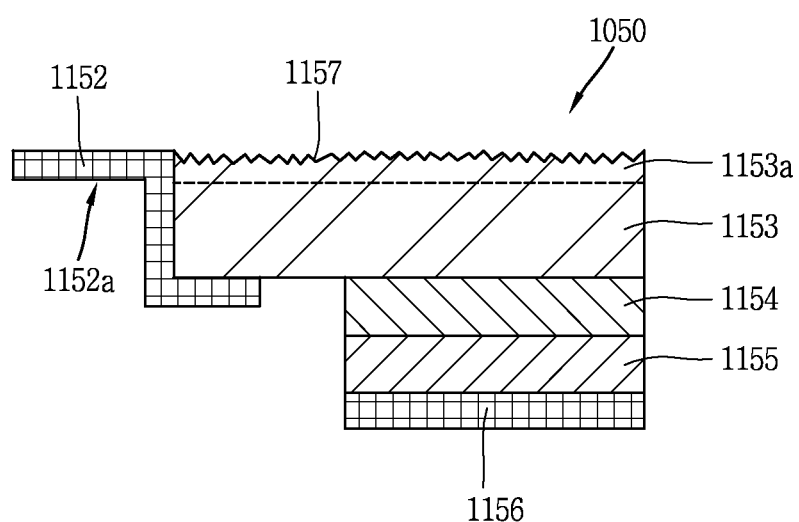
FIG. 12 is a conceptual view illustrating a flip-chip type semiconductor light emitting device of FIG. 11A.

FIG. 10 is an enlarged view of part 'A' in FIG. 1, which illustrates another embodiment of the present invention to which a semiconductor light emitting device of a novel structure is applied. FIG. 11A is a sectional view taken along line 'E-E' in FIG. 10. FIG. 11B is a sectional view taken along line 'F-F' in FIG. 11, and FIG. 12 is a conceptual view illustrating a flip-chip type semiconductor light emitting device of FIG. 11A.

Further, FIG. 10, 11A and 11B illustrate a display device 1000 using a passive matrix (PM) type semiconductor light emitting device. However, the following embodiment is also applicable to an active matrix (AM) type semiconductor light emitting device. As shown, the display device 1000 includes a substrate 1010, a first electrode 1020, a conductive adhesive layer 1030, a second electrode 1040, and a plurality of semiconductor light emitting devices 1050. Each of the first electrode 1020 and the second electrode 1040 includes a plurality of electrode lines.

As discussed above, the substrate 1010, a wiring substrate where the first electrode 1020 is arranged, includes polyimide (PI) so as to implement a flexible display device. Further, any material having an insulation property and flexibility can be used. As shown, the first electrode 1020 is positioned on the substrate 1010, and is formed as a bar long in one direction. The first electrode 1020 serves as a data electrode.

The conductive adhesive layer 1030 is formed on the substrate 1010 where the first electrode 1020 is positioned. Like in a display device to which the aforementioned flip-chip type light emitting device has been applied, the conductive adhesive layer 1030 can be an anisotropy conductive film (ACF), an anisotropy conductive paste, a solution containing conductive particles, etc. In this embodiment, the conductive adhesive layer 1030 can be replaced by an adhesive layer. For instance, if the first electrode 1020 is integrally formed with a conductive electrode of a semiconductor light emitting device without being positioned on the substrate 1010, the adhesive layer can require no conductivity.

A plurality of second electrodes 1040, electrically connected to the semiconductor light emitting devices 1050, are positioned between the semiconductor light emitting devices 1050, in a direction to cross a lengthwise direction of the first electrode 1020. As shown, the second electrode 1040 is positioned on the conductive adhesive layer 1030. That is, the conductive adhesive layer 1030 is disposed between a wiring substrate and the second electrode 1040. The second electrode 1040 can be electrically connected to the semiconductor light emitting device 1050 by contact.

With the aforementioned structure, the plurality of semiconductor light emitting devices 1050 are coupled to the conductive adhesive layer 1030, and are electrically connected to the first electrode 1020 and the second electrode 1040. In some cases, a transparent insulating layer including silicone oxide (SiOx), etc. can be formed on the substrate 1010 where the semiconductor light emitting devices 1050 have been formed. When arranging the second electrode 1040 after forming the transparent insulating layer, the second electrode 1040 is positioned on the transparent insulating layer. The second electrode 1040 can be formed to be spaced from the conductive adhesive layer 1030 or the transparent insulating layer.

As shown, the plurality of semiconductor light emitting devices 1050 form a plurality of rows in a direction parallel to a plurality of electrode lines of the first electrode 1020. However, the present invention is not limited to this. For instance, the plurality of semiconductor light emitting devices 1050 can form a plurality of rows along the second electrode 1040.

The display device 1000 further includes a phosphor layer 1080 formed on one surface of the plurality of semiconductor light emitting devices 1050. For instance, the plurality of semiconductor light emitting devices 1050 are blue semiconductor light emitting devices which emit blue (B) light, and the phosphor layer 1080 is configured to convert the blue (B) light into a color of a sub pixel. The phosphor layer 1080 can be a red phosphor 1081 or a green phosphor 1082 which constitutes individual pixels. That is, the red phosphor 1081 for converting a blue light (B) into a red light (R) can be deposited on a blue semiconductor light emitting device 1051a, at a position which forms a red sub pixel.

The green phosphor 1082 for converting a blue light (B) into a green light (G) can be deposited on a blue semiconductor light emitting device 1051b, at a position which forms a green sub pixel. A blue semiconductor light emitting device 1051c alone can be formed at a position which forms a blue sub pixel. In this instance, the RGB sub pixels form a single pixel. More specifically, a phosphor of a single color can be deposited along each line of the first electrode 1020. Thus, a single line of the first electrode 1020 serves as an electrode for controlling a single color. That is, R, G, and B colors can be sequentially arranged along the second electrode 1040, thereby implementing sub pixels. However, the present invention is not limited to this. That is, sub pixels which emit red, green and blue (RGB) colors can be implemented as the semiconductor light emitting devices 1050 are combined with quantum dots (QD) rather than phosphors.

For an enhanced contrast of the phosphor layer 1080, the display device can further include a black matrix 1091 disposed between each phosphor. The black matrix 1091 can be configured so that a black material fills a gap formed between phosphor dots. With such a configuration, the black matrix 1091 enhances a contrast between light and shade while absorbing reflected external light. Further, the black matrix 1091 is positioned between each phosphor along the first electrode 1020, in a deposition direction of the phosphor layer 1080. In this instance, no phosphor layer is formed at a position corresponding to the blue semiconductor light emitting device 1051. However, black matrices can be formed at both sides of the blue semiconductor light emitting device 1051c by interposing a space not provided with the phosphor layer therebetween.

The semiconductor light emitting device 1050 according to this embodiment has an advantage of reducing a chip size as electrodes are arranged in a vertical direction. The semiconductor light emitting devices according to an embodiment of the present invention can be flip-chip type semiconductor light emitting devices, under the structure that electrodes are disposed in a vertical direction.

Referring to FIG. 12, the semiconductor light emitting device 1050 includes a first conductive electrode 1156, a first conductive semiconductor layer 1155 where the first conductive electrode 1156 is formed, an activation layer 1154 formed on the first conductive semiconductor layer 1155, a second conductive semiconductor layer 1153 formed on the activation layer 1154, and a second conductive electrode 1152 formed on the second conductive semiconductor layer 1153.

More specifically, the first conductive electrode 1156 can be a p-type electrode, and the first conductive semiconductor layer 1155 can be a p-type semiconductor layer. The second conductive electrode 1152 can be an n-type electrode, and the second conductive semiconductor layer 1153 can be an n-type semiconductor layer. However, the present invention is not limited to this. That is, the first conductive type can be an n-type, and the second conductive type can be a p-type.

More specifically, the first conductive electrode 1156 is formed on one surface of the first conductive semiconductor layer 1155, and the activation layer 1154 is formed between another surface of the first conductive semiconductor layer 1155 and one surface of the second conductive semiconductor layer 1153. The second conductive electrode 1152 is formed on one surface of the second conductive semiconductor layer 1153. In this instance, the second conductive electrode 1152 can be disposed on one surface of the second conductive semiconductor layer 1153, and an undoped semiconductor layer 1153a can be formed on another surface of the second conductive semiconductor layer 1153.

Referring to FIG. 12 with reference to FIGS. 10 to 11B, one surface of the second conductive semiconductor layer 1153 is a surface closest to the wiring substrate, and another surface of the second conductive semiconductor layer 1153 is a surface farthest from the wiring substrate. The first conductive electrode 1156 and the second conductive electrode 1152 are formed to have a height difference in a direction perpendicular to a width direction of the semiconductor light emitting device, when they are spaced from each other along the width direction of the semiconductor light emitting device.

By using the height difference, the second conductive electrode 1152 is formed at the second conductive semiconductor layer 1153. In this instance, the second conductive electrode 1152 is formed close to the second electrode 1040 positioned above the semiconductor light emitting device. At least part of the second conductive electrode 1152 extends from one surface of the second conductive semiconductor layer 1153, to a side surface of the undoped semiconductor layer 1153a. The second conductive electrode 1152 protrudes from a side surface of the undoped semiconductor layer 1153a.

As the second conductive electrode 1152 protrudes from a side surface of the undoped semiconductor layer 1153a, the second conductive electrode 1152 can be exposed to an upper side of the semiconductor light emitting device. Under such a configuration, the second conductive electrode 1152 is disposed at an overlapped position with the second electrode 1040 disposed above the conductive adhesive layer 1030.

More specifically, the semiconductor light emitting device includes a protrusion 1152a extending from the second conductive electrode 1152 and protruding from a side surface of the semiconductor light emitting device. In this instance, the first conductive electrode 1156 and the second conductive electrode 1152 are spaced from each other in a protruding direction of the protrusion 1152a, and are formed to have a height difference therebetween in a direction perpendicular to the protruding direction.

The protrusion 1152a extends from one surface of the second conductive semiconductor layer 1153 to a side surface of the second conductive semiconductor layer 1153, and extends to an upper surface of the second conductive semiconductor layer 1153, i.e., the undoped semiconductor layer 1153a. The protrusion 1152a protrudes from a side surface of the undoped semiconductor layer 1153a along the width direction. Thus, the protrusion 1152a can be electrically connected to the second electrode 1040, in an opposite side to the first conductive electrode based on the second conductive semiconductor layer.

The structure, where the semiconductor light emitting device is provided with the protrusion 1152a, can adopt advantages of the aforementioned horizontal-type semiconductor light emitting device and vertical-type semiconductor light emitting device. The undoped semiconductor layer 1153a can be provided with grooves 1157 on one surface thereof, the one surface farthest from the first conductive electrode 1156. The grooves 1157 can be etched so as to form a texture on one surface of the undoped semiconductor layer 1153a farthest from the first conductive electrode 1156. As the grooves are etched at the undoped semiconductor layer 1153a, texturing can be performed on a flat surface of the semiconductor light emitting device.

Further, the semiconductor light emitting device can be transferred by a transfer head when a display device is manufactured. Thus, one embodiment of the present invention provides a transfer head of a novel structure capable of transferring the semiconductor light emitting device. The transfer head of a novel structure implements a high electrostatic force by directly electrifying the undoped semiconductor layer through a Johnsen-Rahbek method.

Hereinafter, a structure of the transfer head for transferring a semiconductor light emitting device according to an embodiment of the present invention will be explained in more detail. In particular, FIGS. 13A and 13B are a sectional view and a perspective view of a transfer head of a semiconductor light emitting device according to an embodiment of the present invention, and FIG. 14 is a conceptual view illustrating an operation to transfer a semiconductor light emitting device by the transfer head of FIG. 13A.

Figure 13A:
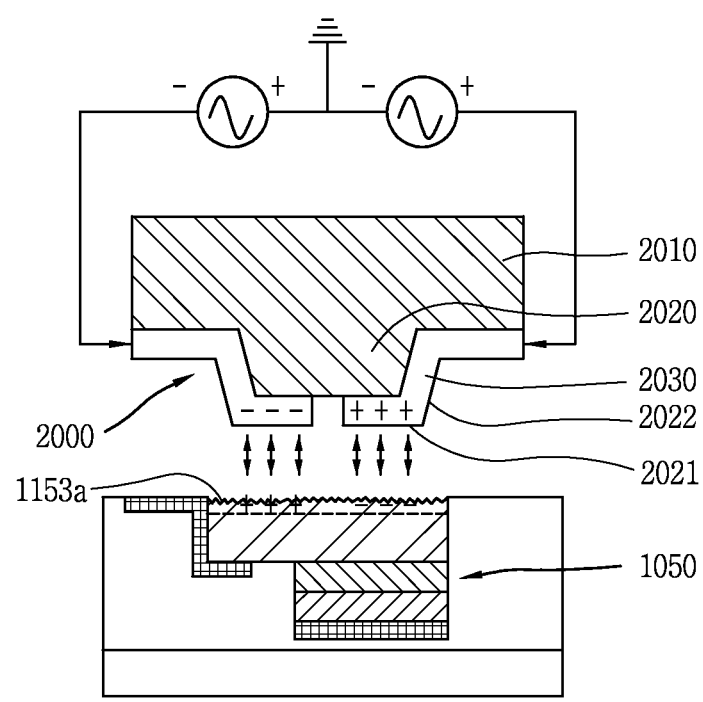
FIGS. 13A and 13B are a sectional view and a perspective view of a transfer head of a semiconductor light emitting device according to an embodiment of the present invention.
Figure 13B:
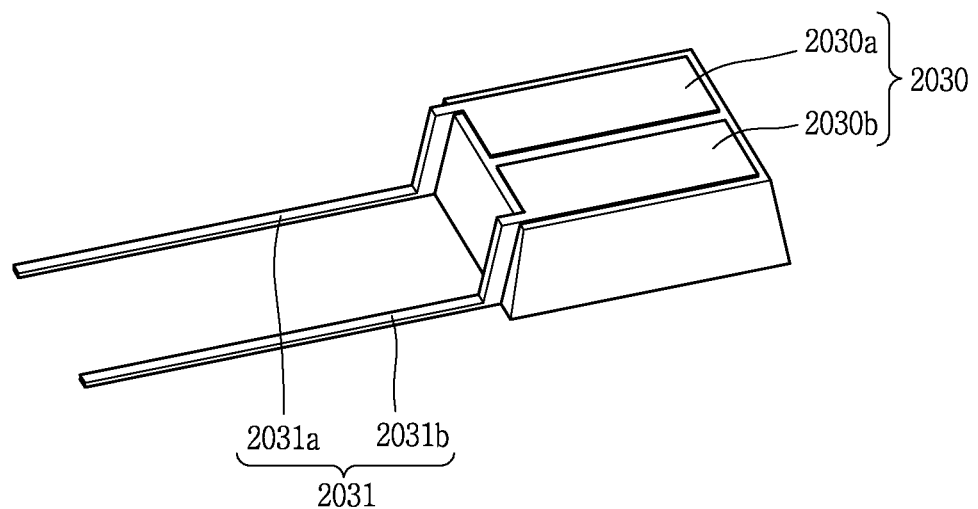
Figure 14:
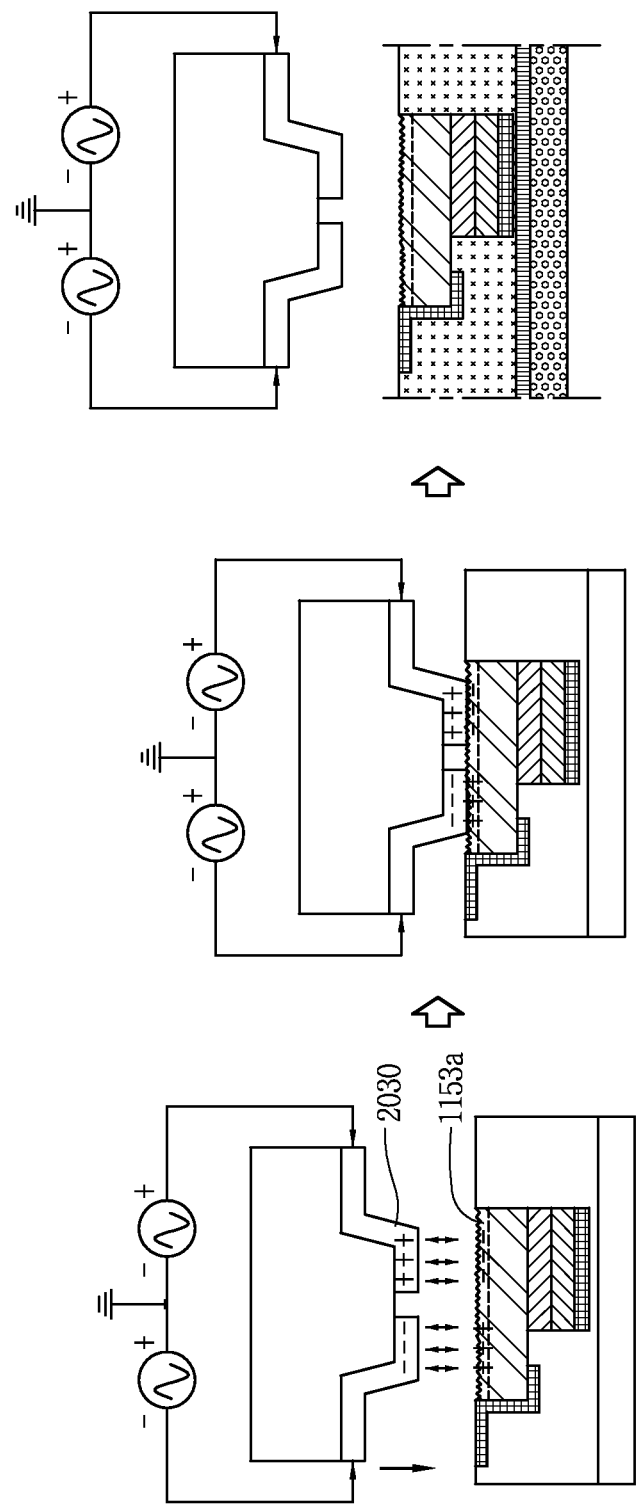
FIG. 14 is a conceptual view illustrating an operation to transfer a semiconductor light emitting device using the transfer head of FIG. 13A.

Referring to FIGS. 13A and 13B, a transfer head 2000 is configured to directly electrify the undoped semiconductor layer 1153a. More specifically, the transfer head 2000 is configured to pick-up the semiconductor light emitting device 1050 using an electrostatic force. In this instance, the electrostatic force is generated as the transfer head 2000 contacts a surface of the undoped semiconductor layer 1153a, and a voltage is applied to the surface for an electrified state of the undoped semiconductor layer 1153a. For this, the transfer head 2000 includes a base substrate 2010, a protrusion 2020 and a head electrode 2030.

The base substrate 2010 can be formed of various materials such as silicon, ceramic and polymer. The base substrate 2010 includes wires connected to an electronic device for controlling the transfer head 2000. As shown, the protrusion 2020 protrudes from the base substrate 2010.

More specifically, the protrusion 2020 may have a mesa structure including an upper surface 2021 and side walls 2022, and can be formed of the same material or a different material as/from the base substrate 2010. The mesa structure is a micro structure, which has a size (width or height) of 100 μm or less than. The protrusion 2020 protrudes from the base substrate 2010 in a direction to become far from the base substrate 2010, thereby providing a contact point for picking-up a specific semiconductor light emitting device during a pick-up operation.

For instance, the protrusion 2020 can be formed as part of the base substrate 2010 is removed by etching, thereby being integrated with the base substrate 2010. Alternatively, the protrusion 2020 can be attached onto the base substrate 2010, and can be grown and patterned on the base substrate 2010. The protrusion 2020 can be a patterned oxide layer such as silicon dioxide formed on a semiconductor substrate such as silicon.

The head electrode 2030 is arranged at the protrusion 2020 so as to generate an electrostatic force by electrifying the undoped semiconductor layer 1153a of the semiconductor light emitting device. In this instance, a passivation layer formed of silicon oxide or aluminum oxide can be formed between the protrusion 2020 and the head electrode 2030.

As shown, a conductive layer can be attached onto the protrusion 2020 or the passivation layer, and be patterned so as to form the head electrode 2030. The conductive layer forms electrode leads 2031 together with the head electrode 2030. The electrode leads 2031 can be connected from the head electrode 2030 to the upper surface 2021 of the protrusion 2020, along the side walls 2022. The head electrode 2030 and the electrode leads 2031 can be formed of a conductive material such as a metal, a metallic alloy, a refractory metal and a refractory metal alloy. For instance, the head electrode 2030 can be an electrode formed of titanium, platinum, silver, chrome, etc., and having a width or a height of 100 μm or less than.

In this embodiment, the head electrode 2030 is exposed to the outside so as to contact the undoped semiconductor layer 1153a of the semiconductor light emitting device. More specifically, the head electrode 2030 is overlapped with an upper surface of the protrusion 2020 farthest from the base substrate 2010, and includes an exposed surface exposed to the outside on the upper surface. The exposed surface can directly contact the undoped semiconductor layer 1153a of the semiconductor light emitting device, for pick-up of the semiconductor light emitting device. In this instance, the exposed surface can be an upper surface 2021 of the transfer head.

The head electrode 2030 can be provided in a pair on the protrusion 2020, and the electrode leads 2031 can be also provided in a pair. However, the present invention is not limited to this. That is, the head electrode can be formed as a single electrode. More specifically, a first head electrode 2030a and a second head electrode 2030b can be spaced from each other on the protrusion 2020.

A first electrode lead 2031a and a second electrode lead 2031b can be connected to electrodes disposed on the upper surface 2021 along the side walls 2022 of the protrusion 2020. An alternating current (AC) power source, configured to apply a voltage to the first head electrode 2030a and the second head electrode 2030b, can be controlled so that a positive voltage is applied to the second head electrode 2030b while a negative voltage is applied to the first head electrode 2030a, and vice versa.

This will be explained in more detail with reference to FIG. 14. Firstly, the transfer head is aligned above a semiconductor light emitting device to be gripped. Then, the head electrode 2030 is driven to contact the undoped semiconductor layer 1153a of the semiconductor light emitting device. Then, the transfer head attaches the semiconductor light emitting device to the head electrode by applying a voltage for generating an electrostatic force to the head electrode, thereby picking-up the semiconductor light emitting device.

Then, the transfer head is moved to a desired place, and the semiconductor light emitting device is placed down by applying an opposite voltage to the voltage and then by stopping the opposite voltage. Finally, the transfer head is lifted. Under the aforementioned structure of the transfer head, the semiconductor light emitting device can be picked-up as the transfer head directly electrifies the semiconductor light emitting device having the undoped semiconductor layer through a Johnsen-Rahbek method.

Hereinafter, a method of manufacturing a display device having the semiconductor light emitting device aforementioned with reference to FIG. 12, using the transfer head aforementioned with reference to FIG. 13A will be explained. In addition, FIGS. 15A to 15G are sectional views illustrating a method of manufacturing a display device having a semiconductor light emitting device, using the transfer head of FIG. 13A.

Firstly, a plurality of semiconductor light emitting devices are coupled to a substrate. For instance, a first conductive semiconductor layer, an activation layer, and a second conductive semiconductor layer are grown on a growth substrate. Then, each semiconductor light emitting device is formed by an etching process, and the first conductive electrode 1156 and the second conductive electrode 1152 are formed (refer to FIG. 15A).

The growth substrate 1101 (wafer) includes at least one material having an optical transmissive characteristic, e.g., sapphire ($Al_2O_3$), GaN, ZnO and AlO. However, the present invention is not limited to this. The growth substrate 1101 can be formed of a carrier wafer, a material suitable for growing a semiconductor material. Alternatively, the growth substrate 1101 can be formed of a material having an excellent thermal conductivity. The growth substrate 1101 can be implemented as a conductive substrate or an insulating substrate. For instance, the growth substrate can be implemented as an SiC substrate having a higher thermal conductivity than a sapphire substrate ($Al_2O_3$), or can be formed of one of Si, GaAs, GaP, InP and $Ga_2O_3$.

The first conductive electrode 1156 can be a p-type electrode, and the first conductive semiconductor layer can be a p-type semiconductor layer. The second conductive electrode 1152 can be an n-type electrode, and the second conductive semiconductor layer can be an n-type semiconductor layer. However, the present invention is not limited to this. That is, the first conductive type can be an n-type, and the second conductive type can be a p-type.

In this instance, as aforementioned, an undoped semiconductor layer 1153a is formed at the second conductive semiconductor layer, and at least part of the second conductive electrode 1152 protrudes from a side surface of the undoped semiconductor layer 1153a. Thus, the semiconductor light emitting device can be a flip-chip type light emitting diode that an n-type semiconductor layer is deposited on the undoped semiconductor layer. An n-type electrode connected to the n-type semiconductor layer extends from one surface of the n-type semiconductor layer, to a side surface of the undoped semiconductor layer. And the n-type electrode protrudes from a side surface of the undoped semiconductor layer. In this instance, grooves can be formed on a surface of the undoped semiconductor layer, the surface facing the head electrode of the transfer head.

Figure 15A:
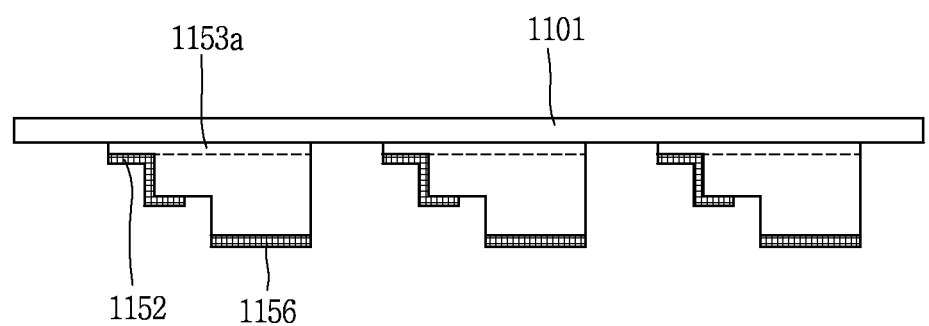
FIGS. 15A to 15G are sectional views illustrating a method of manufacturing a display device having a semiconductor light emitting device, using the transfer head of FIG. 13A.
Figure 15B:
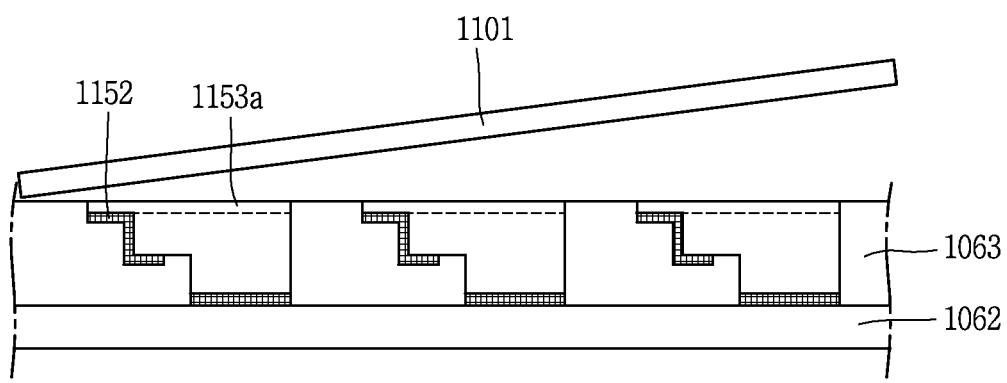

Next, the flip-chip type light emitting device is temporarily coupled to a carrier substrate 1062, and a growth substrate is removed (refer to FIG. 15B). For instance, the growth substrate can be removed by a laser lift-off (LLO) method or a chemical lift-off (CLO) method. When using the laser lift-off (LLO) method, the undoped semiconductor layer 1153a prevents damage of the second conductive electrode 1152 protruding to a side surface of the undoped semiconductor layer 1153a, the damage occurring due to laser beams.

However, the present invention is not limited to this. The undoped semiconductor layer can be replaced by other type of absorption layer for absorbing UV lasers. The absorption layer can be a buffer layer, and can be formed of a material formed at a low temperature atmosphere and capable of attenuating a lattice constant between the semiconductor layer and the growth substrate. For instance, the absorption layer includes a material such as GaN, InN, AlN, AlInN, InGaN, AlGaN and InAlGaN.

As shown, the carrier substrate 1062 includes an adhesive layer 1063, and the semiconductor light emitting device can be transferred to the adhesive layer 1063 from the growth substrate 1101. As another example, the carrier substrate 1062 can be implemented as an adhesion sheet formed of an adhesive material such as polydimethylsiloxane (PDMS). Thus, the carrier substrate 1062 can be referred to as a PDMS substrate. The semiconductor light emitting device 1050 is moved to the carrier substrate 1062 after the growth substrate is removed by an attachment force of the carrier substrate 1062 formed of PDMS.

Figure 15C:
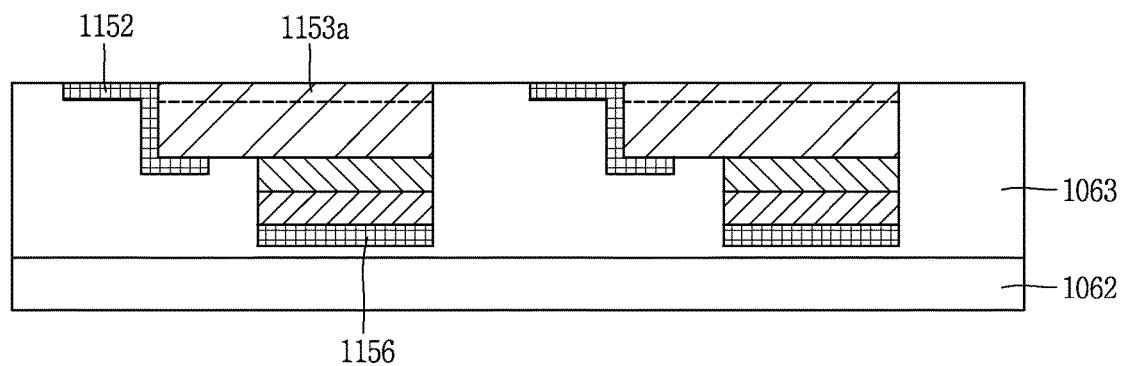
Figure 15D:
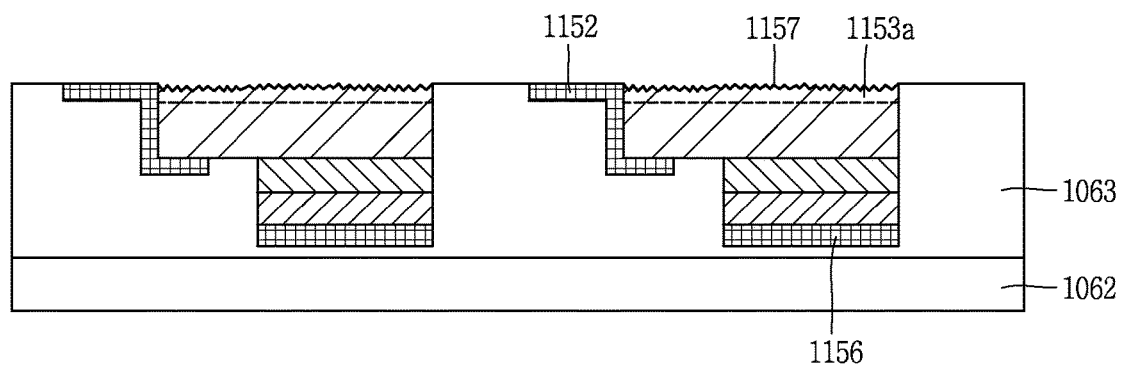

Then, part of the undoped semiconductor layer 1153a, which covers the second conductive electrode 1152, is removed by an etching process (refer to FIG. 15C). In this instance, part of the undoped semiconductor layer 1153a, overlapped with the second conductive semiconductor layer 1153, remains. Then, as shown in FIG. 15D, grooves 1157 are formed at the undoped semiconductor layer 1153a by an etching process. For instance, the grooves 1157 can be etched so as to form a texture on one surface of the undoped semiconductor layer 1153a farthest from the first conductive electrode 1156. As the grooves are etched at the undoped semiconductor layer 1153a, texturing can be performed on a flat surface of the semiconductor light emitting device 1050.

Figure 15E:
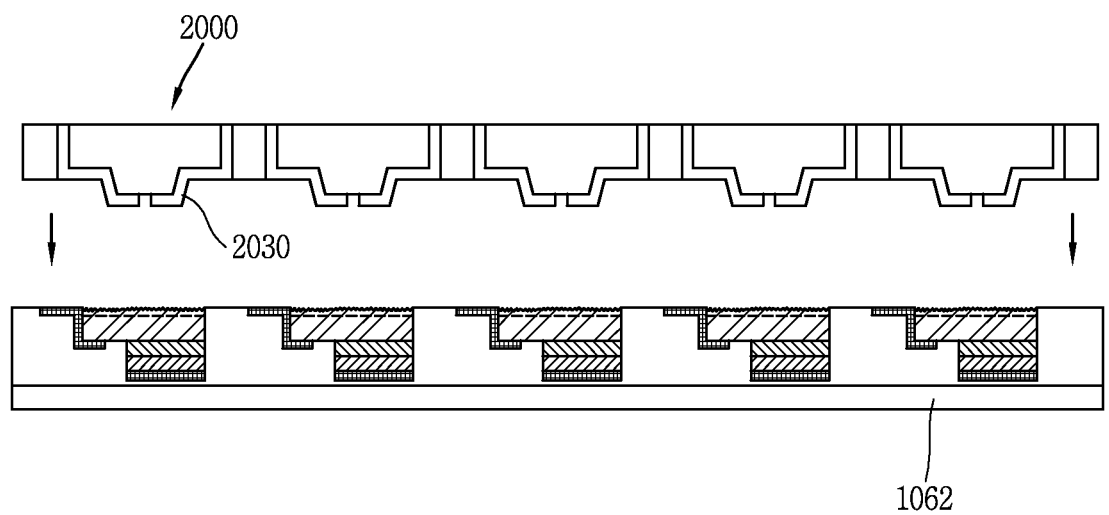

Next, the semiconductor light emitting device is transferred to a base substrate of a display device, from the carrier substrate 1062. Referring to FIG. 15E, the transfer head having the head electrode is positioned so as to face the semiconductor light emitting device having the undoped semiconductor layer, the semiconductor light emitting device arranged on the carrier substrate. Then, the head electrode of the transfer head is positioned close to the undoped semiconductor layer of the semiconductor light emitting device, and the exposed surface of the head electrode is made to contact the undoped semiconductor layer.

The transfer head can be the transfer head aforementioned with reference to FIGS. 13A and 13B. However, the transfer head can be a transfer head according to another embodiment to be explained later. In this embodiment, the transfer head can be a multi-transfer head that the transfer head aforementioned with reference to FIGS. 13A and 13B is arranged in plurality in number. Further, the transfer head can be arranged in a matrix form, so as to correspond to the semiconductor light emitting device arranged on the carrier substrate.

Figure 15F:
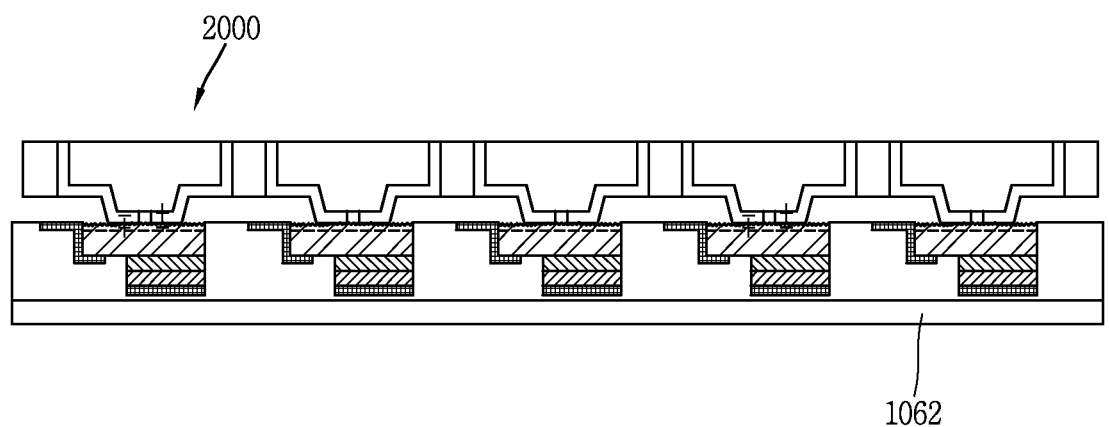

Then, as shown in FIG. 15F, a voltage is applied to the head electrode 2030 so that an attachment force is applied to the undoped semiconductor layer by an electrostatic force. In this instance, the voltage is selectively applied, so that an electrostatic force can be applied to some of the semiconductor light emitting devices arranged on the carrier substrate 1062. The semiconductor light emitting devices can be sequentially arranged on the carrier substrate 1062, and some of the semiconductor light emitting devices arranged on the carrier substrate 1062 can be selectively picked-up.

Figure 15G:
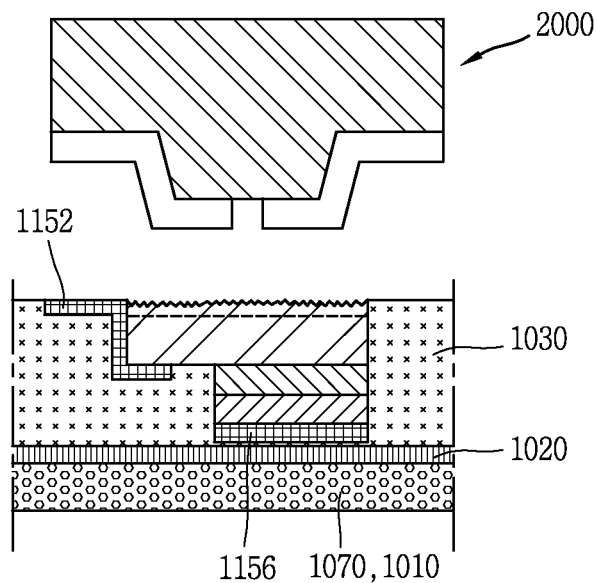

Next, as shown in FIG. 15G, the semiconductor light emitting devices are picked-up to be transferred to the transfer head 2000. The semiconductor light emitting devices are selectively picked-up to be transferred to a base substrate 1070 of the display device. Then, as shown in FIG. 15H, the semiconductor light emitting device is positioned on the base substrate 1070, and the transfer head 2000 is made to return to the original position after the electrostatic force is removed through interruption of the voltage supply.

In this instance, the semiconductor light emitting device is one of a plurality of semiconductor light emitting devices, and the semiconductor light emitting devices can be released on the base substrate 1070 so as to form sub pixels of RGB. The base substrate 1070 can be a wiring substrate 1010 on which a wiring electrode has been formed, and the semiconductor light emitting device can be mounted to the base substrate 1070 by using the conductive adhesive layer 1030 as a medium.

In this instance, the wiring electrode can be the aforementioned first electrode 1020, and the base substrate 1070 can be formed of a flexible material so as to implement a flexible display device. The semiconductor light emitting devices are transferred to the base substrate 1070, and then heat or a catalyst is applied to the conductive adhesive layer 1030, thereby thermally-compressing the semiconductor light emitting devices and the conductive adhesive layer 1030.

In this embodiment, the conductive adhesive layer can be replaced by an adhesive layer. For instance, if the first electrode 1020 is integrally formed with a conductive electrode of the semiconductor light emitting device without being positioned on the substrate 1010, the adhesive layer 1063 may require no conductivity.

Then, the second electrode 1040 (refer to FIG. 11A) can be formed in a direction to cross the first electrode, for connection of the second conductive electrode 1152. The second electrode 1040, an upper wiring for connecting the protruded second conductive electrode 1152, is directly connected to the second conductive electrode 1152. In this instance, the second electrode 1040 can be formed by a deposition process, etc. A step of forming the phosphor layer 1080 (refer to FIG. 10) on one surface of the plurality of semiconductor light emitting devices 1050 can be performed.

So far, a method of manufacturing a display device has been explained. The structure of the transfer head according to an embodiment of the present invention can be modified according to various embodiments, and such embodiments will be explained hereinafter.

Figure 16:
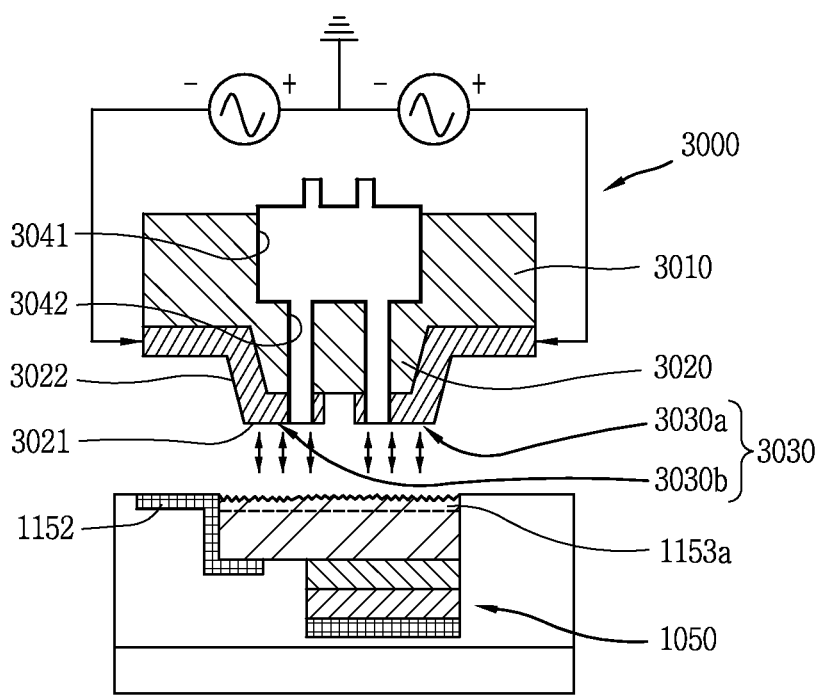
FIGS. 16 to 18 are sectional views illustrating other embodiments of a transfer head for transferring a semiconductor light emitting device according to an embodiment of the present invention.
Figure 17:
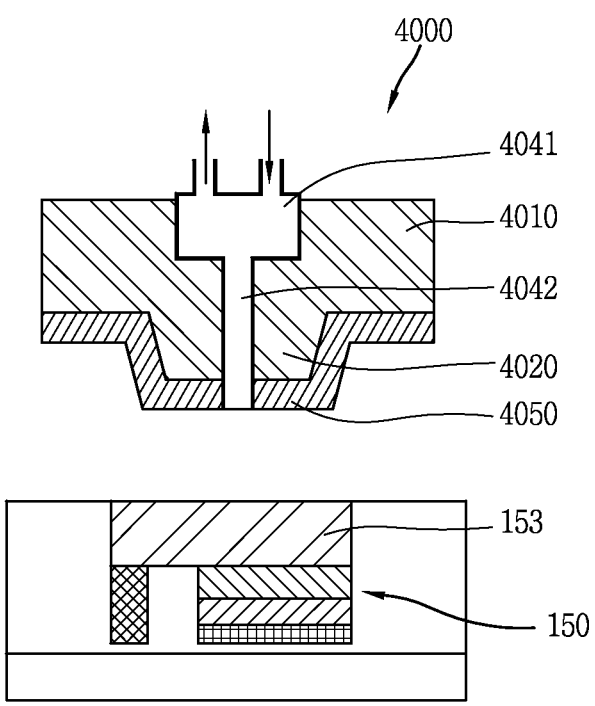
Figure 18:
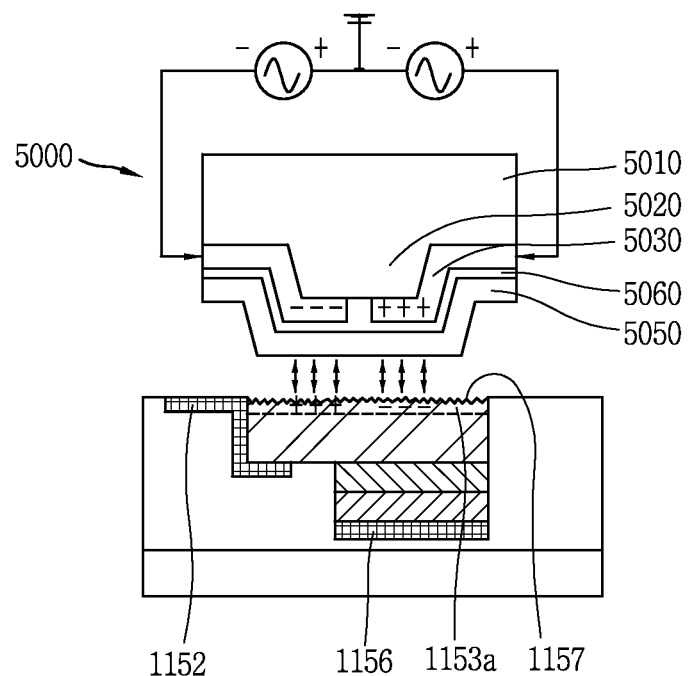

FIGS. 16 to 18 are sectional views illustrating other embodiments of a transfer head for transferring a semiconductor light emitting device according to an embodiment of the present invention. In these embodiments, a novel structure of the transfer head aforementioned with reference to FIGS. 13A and 13B is illustrated. Thus, the same or similar component as/to that of FIGS. 13A and 13B will be provided with the same or similar reference numeral, and detailed explanations thereof will be omitted.

Referring to FIG. 16, a transfer head 3000 includes a base substrate 3010, a protrusion 3020, and a head electrode 3030. The transfer head 3000 further includes a mechanism for providing an attachment force by a vacuum state to a semiconductor light emitting device. The base substrate 3010 is formed of a material which can be etched, e.g., silicon or ceramic, and forms the protrusion 3020 by a front etching process.

The protrusion 3020 has a mesa structure including an upper surface 3021 and side walls 3022, and can be formed of the same material as the base substrate 3010. The protrusion 3020 protrudes from the base substrate 3010 in a direction to become far from the base substrate 3010, thereby providing a contact point for picking-up a specific semiconductor light emitting device during a pick-up operation.

A cavity 3041 is formed on a rear surface of the base substrate 3010 by a rear etching process, and a through hole 3042 for penetrating the base substrate 3010 and the protrusion 3020 is formed by a laser core drilling or a dry etching. In this instance, the transfer head is configured to discharge air inside the through hole 3042 to the outside, such that an attachment force by a vacuum state is provided to the undoped semiconductor layer 1153a of the semiconductor light emitting device. The transfer head can be connected to a device which can alternately perform an evacuation (vacuum state) process and a purge process through the cavity and the through hole.

In this instance, the head electrode 3030 is disposed at the protrusion 3020 so as to generate an electrostatic force by electrifying the undoped semiconductor light emitting layer 1153a of the semiconductor light emitting device. The head electrode 3030 is exposed to the outside so as to contact the undoped semiconductor light emitting layer 1153a of the semiconductor light emitting device. More specifically, the head electrode 3030 is overlapped with an upper surface of the protrusion 3020 farthest from the base substrate 3010, and is provided with an exposed surface exposed to the outside on the upper surface, or an upper surface 3021. The exposed surface may directly contact the undoped semiconductor layer 1153a of the semiconductor light emitting device, for pick-up of the semiconductor light emitting device.

In this instance, an inlet of the through hole 3042 can be disposed at the exposed surface. More specifically, a first head electrode 3030a and a second head electrode 3030b can be spaced from each other on the protrusion 3020. The through hole connected to the cavity is provided in a pair, and the pair of through holes are connected to the first head electrode 3030a and the second head electrode 3030b, respectively.

With the aforementioned structure, the transfer head can implement a high electrostatic force by directly electrifying the undoped semiconductor layer through a Johnsen-Rahbek method, and can transfer the semiconductor light emitting device with a larger grip force by providing a vacuum force to the semiconductor light emitting device. As another example, a transfer head, which has the structure of the cavity and the through hole, without having a head electrode, can be implemented. Referring to FIG. 17, a flexible adhesive layer 4050 can be provided. The flexible adhesive layer 4050, which has the head electrode and the electrode leads of FIG. 16 removed therefrom, is disposed to cover the protrusion 4020, and is formed of a flexible material having viscosity.

More specifically, a transfer head 4000 includes a base substrate 4010, a protrusion 4020, a flexible adhesive layer 4050, and a mechanism for providing an attachment force by a vacuum state to a semiconductor light emitting device. The base substrate 4010 is formed of a material which can be etched, e.g., silicon or ceramic, and forms the protrusion 4020 by a front etching process.

The protrusion 4020 may have a mesa structure including an upper surface 4021 and side walls 4022, and can be formed of the same material as the base substrate 4010. The protrusion 4020 protrudes from the base substrate 4010 in a direction to become far from the base substrate 4010, thereby providing a contact point for picking-up a specific semiconductor light emitting device during a pick-up operation.

A cavity 4041 is formed on a rear surface of the base substrate 4010 by a rear etching process, and a through hole 4042 for penetrating the base substrate 4010 and the protrusion 4020 is formed by a laser core drilling or a dry etching. Unlike in FIG. 16, the through hole 4042 can be formed in one in number. In this instance, the transfer head is configured to discharge air inside the through hole 4042 to the outside, such that an attachment force by a vacuum state is provided to a semiconductor light emitting device. The transfer head can be connected to a device which can perform an evacuation (vacuum state) process and an air purge process through the cavity 4041 and the through hole 4042.

As shown, the through hole 4042 may extend so as to penetrate the flexible adhesive layer 4050. The flexible adhesive layer 4050 fills a gap between the semiconductor light emitting device and the transfer head by contacting one surface of the semiconductor light emitting device, thereby preventing air from being introduced into the through hole 4042 which is in a vacuum state. In this embodiment, the semiconductor light emitting device does not include the undoped semiconductor layer aforementioned with reference to FIG. 4. However, the semiconductor light emitting device can be the vertical-type semiconductor light emitting device aforementioned with reference to FIG. 9. In case of the semiconductor light emitting device of FIG. 4, the flexible adhesive layer 4050 of the transfer head comes in contact with the n-type semiconductor layer 153 of the semiconductor light emitting device.

As another example, the flexible adhesive layer 4050 can be applied to the structure of the transfer head having the electrode shown in FIGS. 13A and 13B. Hereinafter, such a structure will be explained with reference to FIG. 18. Referring to FIG. 18, a transfer head 5000 is configured to electrify the undoped semiconductor layer 1153a without directly contacting thereto.

In this embodiment, the semiconductor light emitting device is the semiconductor light emitting device aforementioned with reference to FIG. 13A. However, the semiconductor light emitting device can be the semiconductor light emitting device aforementioned with reference to FIG. 4, the semiconductor light emitting device aforementioned with reference to FIG. 17, the vertical-type semiconductor light emitting device aforementioned with reference to FIG. 9, etc. As another example, a structure, where an undoped semiconductor layer is deposited on a second conductive semiconductor layer in the semiconductor light emitting device aforementioned with reference to FIG. 4, can be also applicable to this embodiment.

As shown, the transfer head 5000 includes a base substrate 5010, a protrusion 5020, a head electrode 5030, a dielectric film 5060 and a flexible adhesive layer 5050. The base substrate 5010 can be formed of various materials such as silicon, ceramic and polymer. The base substrate 5010 includes wires connected to an electronic device for controlling the transfer head 5000.

As shown, the protrusion 5020 protrudes from the base substrate 5010. More specifically, the protrusion 5020 may have a mesa structure including an upper surface 5021 and side walls 5022, and can be formed of the same material or a different material as/from the base substrate 5010. The protrusion 5020 protrudes from the base substrate 5010 in a direction to become far from the base substrate 5010, thereby providing a contact point for picking-up a specific semiconductor light emitting device during a pick-up operation.

For instance, the protrusion 5020 can be formed as part of the base substrate 5010 is removed by etching, thereby being integrated with the base substrate 5010. Alternatively, the protrusion 5020 can be attached onto the base substrate 5010, and can be grown and patterned on the base substrate 5010. The protrusion 5020 can be a patterned oxide layer such as silicon dioxide formed on a semiconductor substrate such as silicon.

The head electrode 5030 is arranged at the protrusion 5020 so as to generate an electrostatic force by electrifying the undoped semiconductor layer 1153a of the semiconductor light emitting device. In this instance, a passivation layer formed of silicon oxide or aluminum oxide, can be formed between the protrusion 5020 and the head electrode 5030.

As shown, a conductive layer can be attached onto the protrusion 5020 or the passivation layer, and can be patterned so as to form the head electrode 5030. The conductive layer may form electrode leads 5031 together with the head electrode 5030. The electrode leads 5031 can be connected from the head electrode 5030 to the upper surface 5021 of the protrusion 5020, along the side walls 5022. The head electrode 5030 and the electrode leads 5031 can be formed of a conductive material such as a metal, a metallic alloy, a refractory metal and a refractory metal alloy. For instance, the head electrode 5030 can be an electrode formed of titanium, platinum, silver, chrome, etc., and having a width or a height of 100 µm or less than.

In this embodiment, the head electrode 5030 is formed to be covered by the flexible adhesive layer 5050. The flexible adhesive layer 5050 can be formed of a material such as silicon resin, polymer, epoxy, rubber, polyimide (PI) and polydimethylsiloxane (PDMS). The dielectric film 5060 can be disposed between the head electrode 5030 and the flexible adhesive layer 5050. The dielectric film 5060 can be formed of aluminum oxide ($Al_2O_3$), tantalum oxide ($Ta_2O_5$), silicon oxide ($SiO_2$), etc. With such a structure, a coulomb electrostatic grip force can be provided to the semiconductor light emitting device.

More specifically, the flexible adhesive layer 5050 is disposed to cover the protrusion, and is formed of a flexible material having viscosity. The undoped semiconductor layer 1153a of the semiconductor light emitting device can be provided with grooves 1157 on one surface thereof, the one surface farthest from the first conductive electrode 1156. The grooves 1157 can be etched so as to form a text on one surface of the undoped semiconductor layer 1153a farthest from the first conductive electrode 1156.

Generally, an electrostatic transfer head implements an effective electrostatic grip force on a flat surface having no roughness of a semiconductor light emitting device to be picked-up. In case of picking-up a semiconductor light emitting device having a surface roughness, there is a difficulty. In this embodiment, in order to enhance an optical extraction efficiency, not only an electrostatic force of the head electrode is applied to a surface of the semiconductor light emitting device having the grooves, but also the flexible adhesive layer is attached to the surface of the semiconductor light emitting device having the grooves. This can allow a larger grip force to be provided to the surface of the semiconductor light emitting device having the grooves, due to a Van der Waal's interaction.

Further, when simultaneously picking-up a plurality of semiconductor light emitting devices, there may occur a deviation in heights of the plurality of semiconductor light emitting devices. In this instance, the deviation can be overcome to some degree by a flexible adhesive layer serving as a buffer.

As the present features can be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A transferring system having a transfer head and a semiconductor light emitting device,
   wherein the transfer head comprises:
   a base substrate;
   a protrusion protruding from the base substrate;
   a head electrode arranged at the protrusion and configured to generate an electrostatic force by electrifying an undoped semiconductor layer of the semiconductor light emitting device;
   a flexible adhesive layer covering the protrusion and including a flexible material having a viscosity; and
   a dielectric film disposed between the head electrode and the flexible adhesive layer,
   wherein the undoped semiconductor layer is an uppermost layer of the semiconductor light emitting device, and
   wherein the uppermost layer of the semiconductor light emitting device is electrified and in contact with the transfer head.

2. The transferring system of claim 1, wherein the head electrode is exposed so as to contact the undoped semiconductor layer.

3. The transferring system of claim 2, wherein the head electrode is overlapped with an upper surface of the protrusion farthest from the base substrate, and
   wherein the head electrode includes an exposed surface on the upper surface.

4. The transferring system of claim 1, further comprising:
   a through hole formed at the base substrate,
   wherein the transfer head is configured to discharge air through the through hole to provide an attachment force by a vacuum state to the undoped semiconductor layer.

5. The transferring system of claim 4,
   wherein the through hole extends from the base substrate and penetrates the flexible adhesive layer.

6. A method of transferring a semiconductor light emitting device, the method comprising:
   positioning a transfer head having a head electrode facing a semiconductor light emitting device having an undoped semiconductor layer, wherein the semiconductor light emitting device is arranged on a carrier substrate, and the undoped semiconductor layer is an uppermost layer of the semiconductor light emitting device;
   moving the head electrode of the transfer head close to the undoped semiconductor layer of the semiconductor light emitting device;
   applying a voltage to the head electrode to provide an attachment force to the undoped semiconductor layer by an electrostatic force; and
   picking-up the semiconductor light emitting device and transferring the semiconductor light emitting device to a substrate,
   wherein the uppermost layer of the semiconductor light emitting device is electrified and in contact with the transfer head,
   wherein transfer head includes a base substrate, and a protrusion protruding from the base substrate,
   wherein the head electrode is arranged at the protrusion in an exposed state to outside, so as to generate an electrostatic force by electrifying the undoped semiconductor layer of the semiconductor light emitting device, and
   wherein the transfer head further comprises:

a flexible adhesive layer covering the protrusion and including a flexible material having viscosity; and a dielectric film disposed between the head electrode and the flexible adhesive layer.

7. The method of claim 6, wherein the semiconductor light emitting device includes a plurality of semiconductor light emitting devices, and wherein the method further comprises releasing the plurality of semiconductor light emitting devices on the substrate so as to form sub pixels of red, green and blue colors.

8. The method of claim 7, wherein the semiconductor light emitting devices are sequentially arranged on the carrier substrate, and wherein some of the semiconductor light emitting devices arranged on the carrier substrate are selectively picked-up.

9. The method of claim 6, wherein the carrier substrate includes an adhesive layer, and wherein the semiconductor light emitting device is transferred to the adhesive layer from a growth substrate.

* * * * *